United States Patent [19]
Kimata et al.

[11] Patent Number: 6,031,231
[45] Date of Patent: Feb. 29, 2000

[54] INFRARED FOCAL PLANE ARRAY

[75] Inventors: Masafumi Kimata; Tomohiro Ishikawa; Kazuhiko Tsutsumi; Hisatoshi Hata, all of Tokyo, Japan

[73] Assignee: Mitsubishi Denki Kabushiki Kaisha, Tokyo, Japan

[21] Appl. No.: 08/927,407

[22] Filed: Sep. 10, 1997

[30] Foreign Application Priority Data

Jan. 27, 1997 [JP] Japan ............................ 9-012269

[51] Int. Cl.$^7$ ...................................... G01J 5/20
[52] U.S. Cl. .................. 250/332; 250/338.1; 250/338.3
[58] Field of Search ...................... 250/332, 338.1, 250/338.3, 338.4, 339.01, 339.02, 339.04, 370.08

[56] References Cited

U.S. PATENT DOCUMENTS

| | | | |
|---|---|---|---|
| 4,472,239 | 9/1984 | Johnson et al. | 438/49 |
| 5,021,663 | 6/1991 | Hornbeck . | |
| 5,293,041 | 3/1994 | Kruse, Jr. | 250/338.3 |
| 5,369,280 | 11/1994 | Liddiard | 250/370.08 |
| 5,424,544 | 6/1995 | Shelton et al. . | |
| 5,450,053 | 9/1995 | Wood . | |
| 5,640,013 | 6/1997 | Ishikawa et al. | 250/338.4 |

FOREIGN PATENT DOCUMENTS

| | | |
|---|---|---|
| 0 375 205 | 6/1990 | European Pat. Off. . |
| 4-252086 | 9/1992 | Japan .................. 250/332 |

OTHER PUBLICATIONS

Takanori Sone, et al., "Performance of New Handheld IR Camera Using Uncooled Bolometer FPA", SPIE, vol. No. 2744. pp. 52–60.

Masashi Ueno, et al., "Monolithic Uncooled Infrared Image Sensor with 160×120 Pixels", SPIE, vol. No. 2552, pp. 636–643.

R.A. Wood, "High–Performance Infrared Thermal Imaging with Monolithic Silicon Focal Planes Operating at Room Temperature", IEDM (1993), pp. 175–177.

Patent Abstracts of Japan, vol. 017, No. 032 (E–1309), Jan. 21, 1993, JP 04 252086, Sep. 8, 1992.

*Primary Examiner*—Constantine Hannaher
*Assistant Examiner*—Albert Gagliardi
*Attorney, Agent, or Firm*—Oblon, Spivak, McClelland, Maier & Neustadt, P.C.

[57] ABSTRACT

A two-dimensional infrared focal plane array of temperature detecting units is provided with the temperature detecting units being arranged for every pixel in a two-dimensional arrangement on a semiconductor substrate. Each temperature detecting unit is formed integrally with readout circuitry. Each temperature detecting unit further has a temperature detecting portion which is supported by support legs made of a high thermal resistance material to reduce heat flow to the semiconductor substrate. Each temperature detecting unit also has a temperature detecting element with an infrared ray absorbing portion which is spliced by at least one splicing pillar with the temperature detecting element.

19 Claims, 15 Drawing Sheets

INFRARED FOCAL PLANE ARRAY

BACKGROUND OF THE INVENTION

The present invention relates to a two-dimensional infrared focal plane array in which a thermal type light detector is employed.

The thermal type light detector absorbs the infrared rays, when the infrared rays are irradiated, to raise the temperature and to detect the temperature change. FIG. 21 is a perspective view illustrating the structure of one pixel of the two-dimensional infrared focal plane array in which the conventional thermal type light detector comprising a bolometer thin film in which a resistance value changes due to the temperature is employed. Referring to the drawing, reference numeral 901 shows a substrate composed of semiconductor such as silicon. Reference numeral 910 shows an infrared ray detector portion (hereinafter referred to as detector portion) provided across a space from the silicon substrate. Reference numeral 911 shows a bolometer thin film formed on the infrared ray detector portion. Reference numerals 921 and 922 show support legs for floating and raising the infrared ray detector portion 910 from the silicon substrate. Reference numerals 931 and 932 show metal wirings for flowing current to the bolometer thin film. Reference numeral 940 shows a switch transistor for turning on or off the current flowing through the metal wirings 931, 932, and the bolometer thin film 911. Reference numeral 950 shows a signal line connected with a metal wiring 932. Reference numeral 960 shows a control clock line for controlling the on or off of the switch transistor. Reference numeral 970 shows a metal reflection film comprising the detecting portion and the optical resonant structure to increase the absorption of the infrared rays with the detector portion 910.

FIG. 22 is a sectional view illustrating the sectional structure along the current path of the conventional two-dimensional infrared focal plane array shown in FIG. 21. Referring now to FIG. 22, the same reference numerals are given to the same elements as those shown in FIG. 21 (same throughout the following drawings). Reference numeral 980 shows an insulating film. Reference numeral 990 shows a cavity portion. Reference numerals 930 and 933 show insulating films. Reference numerals 926 and 927 show contact portions. Any switch transistor, signal line, control clock line or the like, not directly related to the invention, has been omitted. A bolometer thin film is formed on the aforementioned detector portion 910. The bolometer thin film is connected with the metal wirings 931 and 932. The bolometer thin film is connected through the contact portions 926 and 927 with a signal readout circuit formed (not shown) on the silicon substrate. The bolometer thin film 911 and the metal wirings 931 and 932 are covered with insulating films 930 and 933 composed of silicon dioxide film (SiO$_2$) or silicon nitride film (SiN) or the like. The insulating films 930 and 933 form the mechanical structure of the detector portion 910 and the support legs 921 and 922. The insulating film 980 is one for insulating the signal readout circuit formed on the silicon substrate 901, and the metal wirings 931 and 932. On the metal reflection film 970 of the insulating film 980 is positioned a detector portion 910 through the cavity portion 990. On the surface of the metal reflection film 970 is occasionally formed another insulating film.

The operation of the two-dimensional infrared focal plane array using the thermal type light detector will now be described. The infrared rays will be incident from a side where the detector portion 910 exists and will be absorbed by the detector portion 910. Since the incident infrared rays can generate standing waves so that the position of the metal reflection film 970 can be a section due to the existence of the metal reflection film 970, the absorption in the detector portion 910 can be increased by the proper setting of the interval between the detector portion and the metal oxide reflection film. The energies of the infrared rays absorbed by the detector portion 910 are converted into heat to raise the temperature of the detector portion 910. The temperature rise depends upon the amount of the incident infrared rays (the amount of the incident infrared rays depends upon the temperature and the emissivity of the image object). Since the amount of the temperature rise can be obtained by the measuring of the change in the resistance value of the bolometer thin film, the amount of the incident infrared rays irradiated by the image object can be obtained from the change of the resistance value of the bolometer.

When the resistance temperature factor of the bolometer thin film is the same, the resistance change to be obtained by the incident infrared rays of the same amount becomes larger and the sensitivity becomes higher, with larger temperature rise of the detector portion. To increase the temperature rise, it is effective to make any heat escaping to the silicon substrate 901 from the detector portion 910 as small as possible. As a result, the support legs 921 and 922 are designed so that the heat resistance is as large as possible. It is important to make the thermal capacity portion of the detector portion 910 small so that the temperature time constant of the detector portion 910 can be short as compared with the frame time of the image device.

Although the infrared rays become incident onto the area of the whole pixel, only a part are incident onto the detector portion 910 and, thus, contribute to the temperature rise of the detector portion 910 (although some infrared rays incident on the support legs close to the detector portion 910 are effective) and the infrared rays incident onto other parts of the area become ineffective. As the result, to increase the sensitivity, it is effective to make the fill factor larger (a ratio of an area of the detector portion with respect to the pixel area).

In the conventional structure shown in FIG. 21 and FIG. 22, the detector portion 910 has to be formed in an area except for at least the support legs 921, 922 and the contact portions for connecting the readout circuit formed on the support legs and the silicon substrate. The fill factor is subjected to restriction in accordance with the design of the interval tolerance between the support leg and the contact portion, and these portions and the detector portion 910, thus interfering with high sensitivity.

The problem becomes remarkable as the pixels become smaller, thus making it difficult to have higher resolution by using the smaller pixels in such a manner that the sensitivity is retained.

The invention is achieved to resolve the aforementioned problems. An object of the invention is to provide a highly sensitized two-dimensional infrared focal plane array having pixels capable of achieving the higher fill factor independently of the design of the support legs for forming of the adiabatic structure, metal wirings, contact portions and so on, in a two-dimensional infrared focal plane array for forming the thermal type light detector on the substrate the same as that of the signal readout circuit.

SUMMARY OF THE INVENTION

The two-dimensional infrared focal plane array in which the thermal type light detector is employed according to the invention has, as separate structure, an infrared ray absorbing portion for absorbing the infrared rays to raise the temperature of the detector portion, and a temperature detecting portion for forming the bolometer thin film to detect the temperature rise.

The two-dimensional infrared focal plane array using the thermal type light detector of the invention, with the separate infrared ray absorbing portion and the separate temperature detecting portion, can provide for independent design of the infrared ray absorption portion to make the area of the infrared ray absorbing portion larger to provide for a more effective fill factor. Therefore, the image element of the invention is effective for higher sensitization.

In order to solve the above mentioned problem, the two-dimensional infrared focal plane array of the invention is a two-dimensional infrared focal plane array comprising temperature detecting units in which the temperature detecting units are arranged for every pixel in a two-dimensional arrangement on a semiconductor substrate, the temperature detecting unit being formed integrally with a thermal type light detector and a means for detecting a change in characteristic of the thermal type light detector, the change being caused by an incident infrared ray, wherein a temperature detecting portion which is supported by support legs comprising a high thermal resistance material capable of reducing a heat flow to the semiconductor substrate and has a temperature detecting element, and an infrared ray absorbing portion which is spliced by at least one splicing pillar with the temperature detecting element are provided for every pixel on the semiconductor substrate.

It is desirable to make thermal resistance larger by providing the temperature detecting portion above a cavity portion which is formed in the semiconductor substrate.

It is desirable for increasing the optical absorption that the infrared ray absorbing structure comprising of the reflection film and the interlayer insulating film is provided on at least one part of the infrared ray absorbing portion.

It is desirable for increasing the optical absorption that the optical resonant structure comprising the reflection film, the interlayer insulating film and the metal infrared ray absorption thin film is provided on at least one part of the infrared ray absorbing portion.

It is desirable in terms of the simplified manufacturing process that at least one part of the splicing pillar is made of the same material as the infrared ray absorbing portion.

It is desirable in terms of the simplified manufacturing process that the optical resonant structure comprising the reflection film, the interlayer insulating film and the metal infrared ray absorbing thin film is provided on at least one part of the infrared ray absorbing portion, and the splicing pillar is formed in one body with the metal infrared ray absorbing film.

It is desirable in terms of thermal capacity reduction that at least one part of the splicing pillar is formed of the same material as the infrared ray absorbing portion and the portion, in contact with the temperature detecting portion, of the infrared ray absorbing portion is removed.

It is desirable in terms of enlarged wide selection in reduction of unnecessary substrate etching and the selection of the manufacturing process that at least one etching hole penetrating from the infrared ray absorbing portion to the cavity portion is provided in the vicinity of the center of the cavity portion.

It is desirable in terms of enlarged wide selection in reduction of unnecessary substrate etching and the selection of the manufacturing process that the etching stop layer is provided of a material resistant to the etchant which is employed when forming the cavity portion in the semiconductor substrate around the cavity portion.

It is desirable to compose a bolometer with a material which cannot be used in the semiconductor process and to form the temperature detecting element on the surface of the infrared ray absorbing portion.

It is desirable in terms of the wide selection of the etching method for forming the cavity portion and in terms of the effective use of an area to arrange one portion of the components of the readout circuit in the area under the cavity portion and to provide the temperature detecting portion above the readout circuit on the semiconductor substrate.

It is desirable in terms of increasing the optical absorption that the infrared ray absorbing structure comprising the reflection film and interlayer insulating film is provided on at least one part of the infrared ray absorbing portion.

It is desirable in terms of increasing optical absorption that the optical resonant structure comprising the reflection film, interlayer insulating film and the metal infrared ray absorbing film is provided on at least one part of the infrared ray absorbing portion.

It is desirable in terms of manufacturing simplification that at least one part of the splicing pillar is made of the same material as the infrared ray absorbing portion.

It is desirable in terms of manufacturing simplification that the optical resonant structure comprising the reflection film, interlayer insulating film and the metal infrared ray absorbing film is provided on at least one part of the infrared ray absorbing portion, and the splicing pillar is formed in one body with the metal infrared ray absorbing film.

It is desirable in terms of detecting effectively the temperature change that a bolometer thin film is provided as the temperature detecting element.

It is desirable in terms of effective detection of the temperature change that a ferroelectric substance having a pyroelectric effect is employed as the temperature detecting element.

It is desirable in terms of effective detection of the temperature change that a thermopile is employed as the temperature detecting element.

It is desirable in terms of the temperature equality of the detector portion that the splicing pillar is provided below a position adjacent to the center of the gravity of the infrared ray absorbing portion.

It is desirable that the thermal resistance of the splicing pillar is smaller than the thermal resistance of the support leg.

A manufacturing method of two-dimensional infrared focal plane array of the invention comprising:

a) on a semiconductor substrate, a step of forming a signal readout circuit, then forming an insulating film, contact portions, further forming metal wirings and a temperature detecting element, and covering with a protective insulating film as a whole;

b) a step of forming sacrifice layer on the protective insulating film, removing an area for forming a splicing pillar layer by photolithography technique, the area being one of the sacrifice layer, then filling a material to be the splicing pillar layer into the removed area;

c) on the sacrifice layer and the splicing pillar layer, a step of forming a thin film to be an infrared absorbing portion, then patterning for deviding the infrared ray absorbing portion for every pixel;

d) a step of etching the sacrifice layer to remove;

e) a step of etching the silicon substrate to form a cavity portion in said silicon substrate.

It is desirable in terms of simplified formation of the infrared ray absorbing portion to use an etchback operation of the surface of the sacrifice layer and the splicing pillar to flatten the surface thereof, in the above described b) step.

In the above described e) step, it is desirable to manufacture the size of the cavity portion with proper controlling property that the cavity portion is formed to effect an anisotropic etching operation of the semiconductor substrate.

It is desirable in terms of sufficient etching speed to effect an anisotropic etching portion with either of potassium hydroxide, and tetramethyl ammonium hydroxide.

DETAILED DESCRIPTION

Embodiments according to the present invention will be described below referring now to the accompanying drawings.

Embodiment 1

Figure 1:
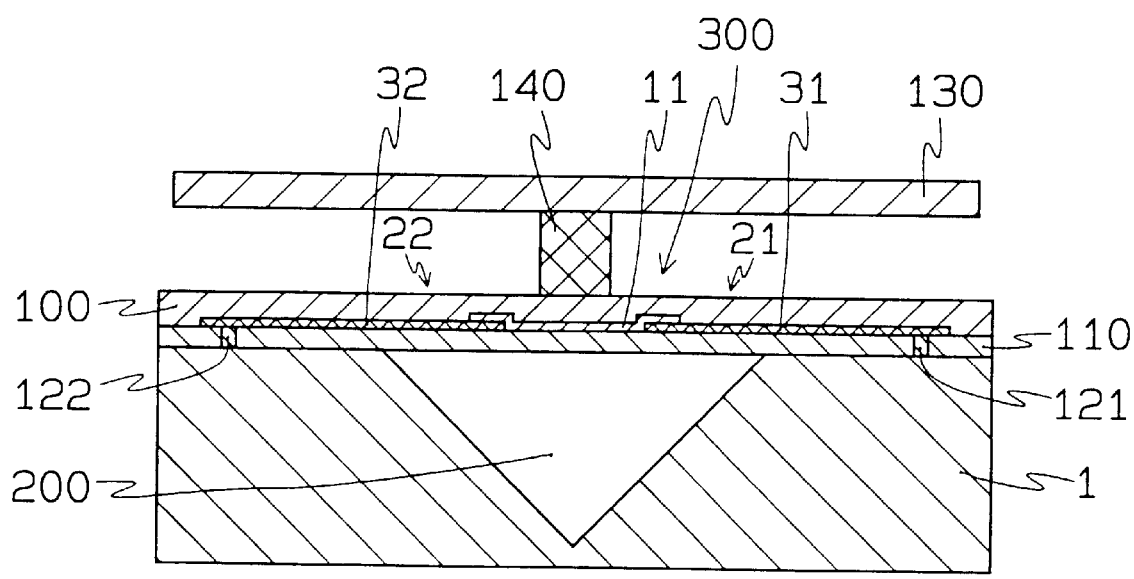
FIG. 1 is a cross-sectional view illustrating the pixel in the two-dimensional infrared focal plane array in which a thermal type light detector is employed according to an embodiment of the present invention.

FIG. 1 is a sectional view illustrating the sectional structure along a current route of one pixel of the two-dimensional infrared focal plane array using the thermal type light detector in the embodiment 1 of the invention. Referring now to the drawing, a signal readout circuit provided on the silicon substrate 1, irrelevant directly to the invention, is omitted for brief explanation. In FIG. 1, reference numeral 1 shows a silicon substrate as a semiconductor substrate. Reference numeral 11 shows a bolometer thin film as a temperature detecting element for detecting the temperature change. Reference numerals 21 and 22 show support legs. The support legs are provided on the cavity portion 200 formed in the silicon substrate 1 and floats the temperature detecting portion 300 including the bolometer thin film.

Reference numerals 31 and 32 show metal wirings. The metal wiring is made of, for example, aluminum, titanium, tungsten, and titanium nitride or the like and connects the bolometer thin film 11 with the readout circuit. Reference numeral 100 shows an insulating film (protective insulating film). Reference numeral 110 shows an insulating film. Two insulating films, made of silicon dioxide ($SiO_2$) film or silicon nitride (SiN) film or the like, which are each, respectively, a material large in thermal resistance, for reducing the outward flow of the heat (heat flow) into the silicon substrate. The two insulating films support the temperature detecting portion, composing the mechanical structure of the support legs 21, 22 and the temperature detecting portion 300. Reference numerals 121 and 122 show contact portions for connecting the metal wirings 31 and 32 with the signal readout circuit and can be formed by a sputter method and a CVD method by using aluminum and tungsten. Reference numeral 130 shows an infrared ray absorbing portion for absorbing the infrared rays and converting them into heat. It can be formed by the CVD method by using silicon dioxide ($SiO_2$), silicon nitride (SiN) and so on. Furthermore, the infrared absorbing portion can be composed of a laminated film of silicon dioxide and silicon nitride. Reference numeral 140 shows a splicing pillar. The splicing pillar maintains the infrared ray absorbing portion away from the temperature detecting portion 300 and thermally couples the infrared ray absorbing portion 130 with the temperature detecting portion 300. It can be formed by the CVD method or the like by using silicon dioxide and silicon nitride. Furthermore, the splicing pillar can be composed of a laminated film of silicon dioxide and silicon nitride. Reference numeral 200 shows a cavity portion formed within the silicon substrate 1. Reference numeral 300 shows a temperature detecting portion. The thermal type light detector, as in the conventional one, absorbs the incident infrared rays to raise the temperature and detect the temperature change. In the invention, the thermal type light detector is composed of the infrared ray absorbing portion and the temperature detecting element. The temperature detecting element detects the temperature change. The temperature change caused by the infrared ray absorbing portion through the incident infrared rays is transmitted through the splicing pillar. The temperature change is detected by the detection of the characteristic change such as an electric resistance change. Circuitry for readout of a signal indicating the change caused in the temperature detecting element is composed of metal wiring, a signal readout circuit and contact portions. In the invention, a material to be used as the temperature detecting element is a bolometer thin film, a ferroelectric substance having pyroelectric effect or a thermopile or the like. An example of a material of the bolometer thin film comprises vanadium oxide, polycrystalline silicon, amorphous silicon or the like. An example of the ferroelectric substance having the pyroelectric effect comprises lead zirconate titanate (PZT), lead titanate (PT), and barium strontium titanate (BST). An example of the thermopile material comprises splicing between p-type silicon and n-type polycrystalline silicon and splicing of polycrystalline silicon and aluminum. Furthermore, in the two-dimensional infrared focal plane array device according to the invention, the thermal type light detector and readout circuitry are integrated to compose the temperature detecting unit, and the temperature detecting unit is arranged in two-dimension for each of the pixels on the silicon substrate.

Figure 2:
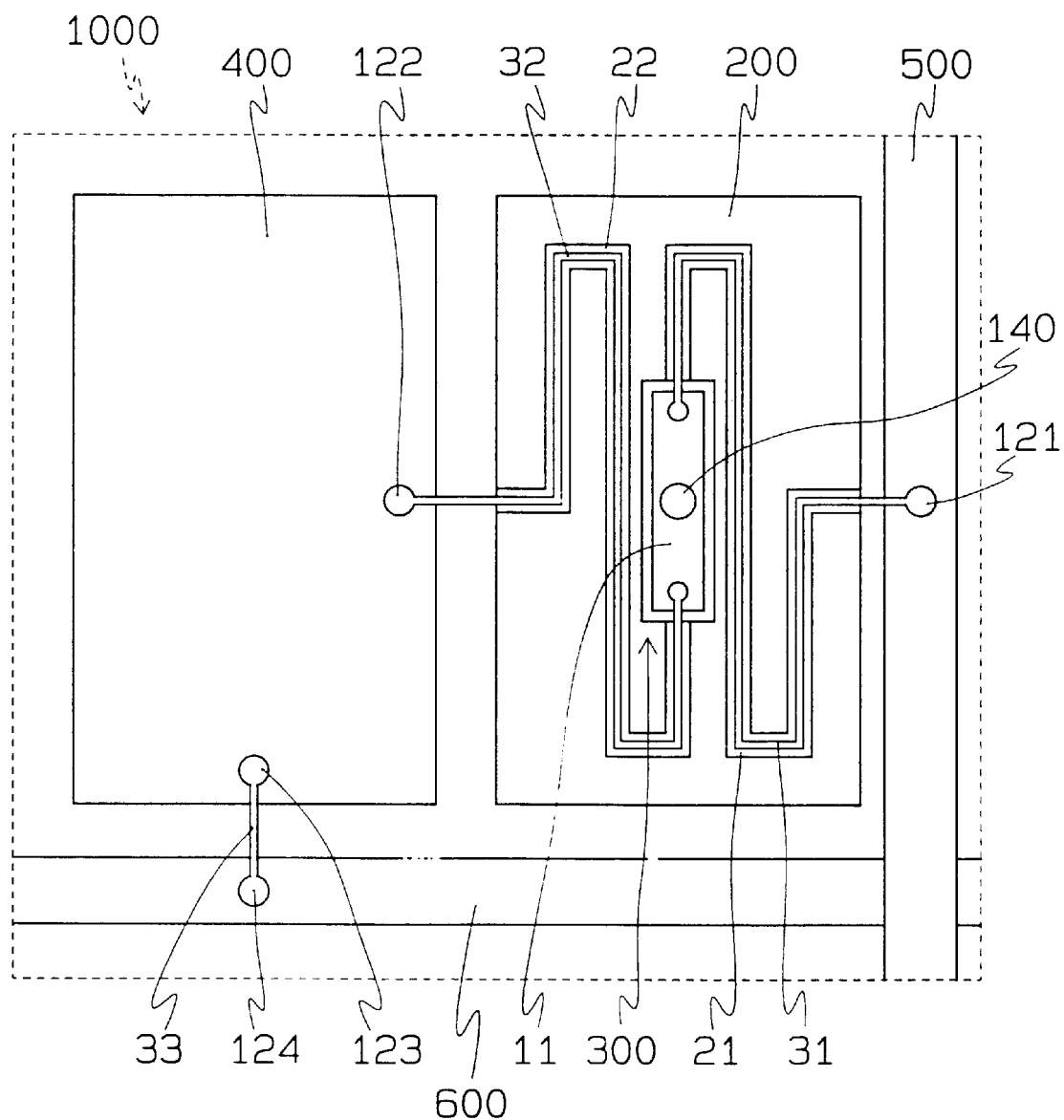
FIG. 2 is a plan view illustrating the pixel in the two-dimensional infrared focal plane array except for the infrared ray absorbing portion in which a thermal type light detector is employed according to an embodiment of the present invention.

FIG. 2 is an explanatory plan view illustrating the planar layout of the portion, except for the infrared ray absorbing portion 130, of one pixel in the two-dimensional infrared focal plane array shown in FIG. 1. In FIG. 2, reference numeral 1000 shows one pixel. Reference numeral 400 shows one portion of a signal readout circuit comprising an MOS transistor and a diode placed in the pixel portion. Reference numeral 500 shows a signal line for readout of the signals. Reference numeral 600 shows a control clock path line for controlling the signal readout circuit 400. Reference numeral 33 shows a metal wiring for connecting the signal readout circuit 400 with the control clock path line 600. Reference numerals 123 and 124 show contact portions for connecting the metal wiring 33, the signal readout circuit 400 and the control clock path line 600. The other portions are represented with the same reference numerals as those shown in FIG. 1.

In the two-dimensional infrared focal plane array of the invention, metal wiring, a signal readout circuit and contact portions, are provided in each pixel in such a manner that an integrated arrangement is provided that is arranged in two-dimensions for each of the pixels on a silicon substrate as the semiconductor substrate. The temperature detecting portion 300 of the integrated arrangement is composed of two insulating films 100, 110 and a bolometer thin film 11. The bolometer thin film is supported as a mechanical structure body by means of the structure with the insulating film 100 arranged in the upper layer and the insulating film 110 arranged in the lower layer.

The temperature detecting portion has a splicing pillar formed on the insulating film 100 and receives the heat from the infrared absorbing portion 130 through the splicing pillar. The resistance change in the bolometer thin film caused by the heat is caused between a signal line 500 through the metal wiring 31 and the contact portion 121, and a signal readout circuit 400 through the metal wiring 32 and the contact portion 122. The support leg 21 is mechanical structure body with the metal wiring 31, which is interposed between two insulating films 100 and 110, and the support leg 22 is also a mechanical structure body as in the support leg 21. Each insulating film of several hundreds nanometers is formed approximately 1 through 3 $\mu$m in width, and approximately 1 $\mu$m in the total of the thickness. Two support legs 21 and 22 support the temperature detecting portion 300 and the metal wiring 31 and 32 to float them on the cavity portion 200. The temperature detecting portion 300, as a mechanical structure body, the support legs 21 and 22 composed of two insulating films 100 and 110 support the infrared ray absorbing portion supported by the bolometer thin film 11 and the splicing pillar 140. The support legs 21 and 22 are composed of an insulting film made of a material, large in thermal resistance, for reducing the outward flow of the heat into the silicon substrate as described above. Furthermore, to make the thermal resistance larger, the length can be made sufficient by making the metal wirings 31 and 32 crawl meanderingly as shown in FIG. 2.

Figure 3:
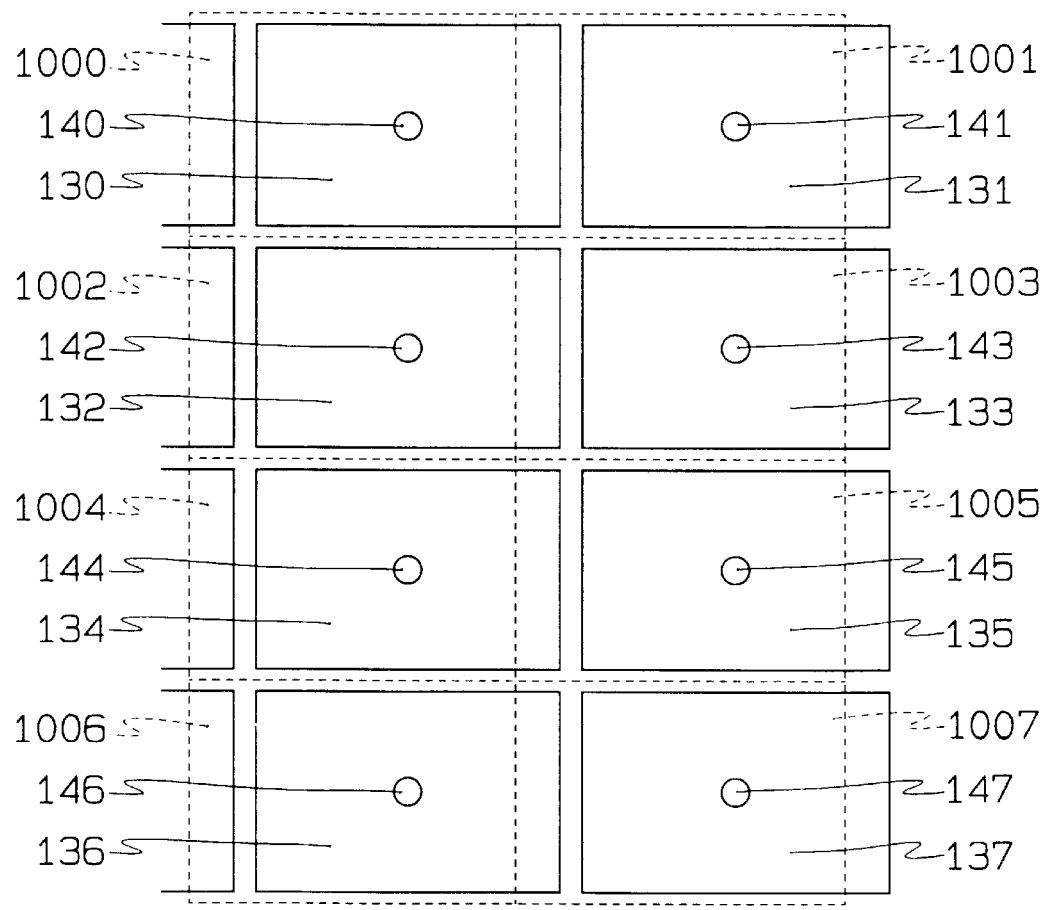
FIG. 3 is a plan view illustrating the arrangement of the pixels in the two-dimensional infrared focal plane array in which a thermal type detector is employed according to an embodiment of the present invention.

FIG. 3 is a plan view illustrating a condition where plural pixels shown in FIG. 1 and FIG. 2 are arranged on the silicon substrate (not shown), with one portion of the arrangement of pixels of 2×4 and each of four adjacent infrared ray absorption portion for brief explanation. Referring now to FIG. 3, rectangular portions 1000 through 1007 shown in broken lines show the same pixels as the pixels shown by numeral 1000 in FIG. 2 and the structure of the interior of the pixel is omitted except for the splicing pillars 140 through 147 shown in solid lines. In FIG. 3, the rectangular portions 130 through 137 shown in solid lines are infrared ray absorbing portions shown at 130 of FIG. 1. The infrared ray absorbing portion is supported away from the silicon substrate by the splicing pillars 140 through 147. The pixels

1000 through 1007 formed on the surface of the silicon substrate and the infrared ray absorbing portions 130 through 137 may be deviated as shown in the drawing, without being formed on the same area superposed in plane.

As shown in the drawing, each area of the infrared ray absorbing portions 130 through 137 is an area except for slight space among the infrared ray light receiving elements from the pixel area and the fill factor of the portion becomes much larger. Thus, although there is conventionally the limitation that the area of the infrared ray absorption portion cannot be made larger because the infrared ray absorbing portion and the temperature detecting portion are one unit, the present invention can make the area of the infrared ray absorbing portion larger.

The operation of the pixel of the two-dimensional infrared focal plane array in which the thermal type light detector is employed according to the invention will now be described. The infrared rays are incident from the side of the infrared ray absorbing portion 130. The incident infrared rays are absorbed by the infrared ray absorbing portion 130, and the temperature of the infrared ray absorbing portion 130 is raised. The temperature change in the infrared ray absorbing portion 130 is transmitted to the temperature detecting portion 300 through the splicing pillar 140 to raise the temperature in the temperature detecting portion 300. The thermal resistance of the splicing pillar 140 is designed to be smaller as compared with the thermal resistance of the support legs 21 and 22.

The thermal capacity totaled in three structure bodies of the temperature detecting portion 300, the splicing pillar 140 and the infrared ray absorbing portion 130, and the time constant to be decided by the thermal resistance of the support legs 21 and 22 are designed to be shorter than the frame time (time required to read all the signals equivalent to one picture area portion or time required to read the signals of all the pixels of the focal plane array). The temperature rise in the temperature detecting portion 300 becomes almost the same as the temperature rise in the infrared ray absorbing portion 130. Therefore, as the effective fill factor is determined by the area of the infrared ray absorbing portion 130, the fill factor can be made much larger as described above.

Figure 4A:
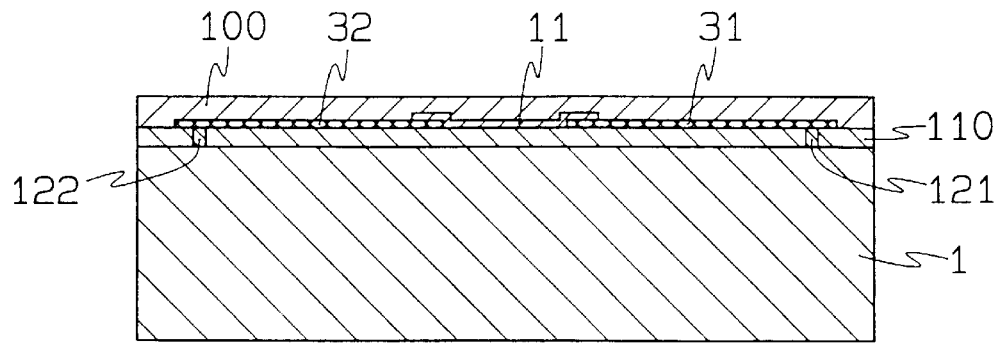
FIGS. 4(a) through 4(c) are cross-sectional views illustrating the process for the pixel in the two-dimensional infrared focal plane array in which a thermal type detector is employed according to an embodiment of the present invention.
Figure 4B:
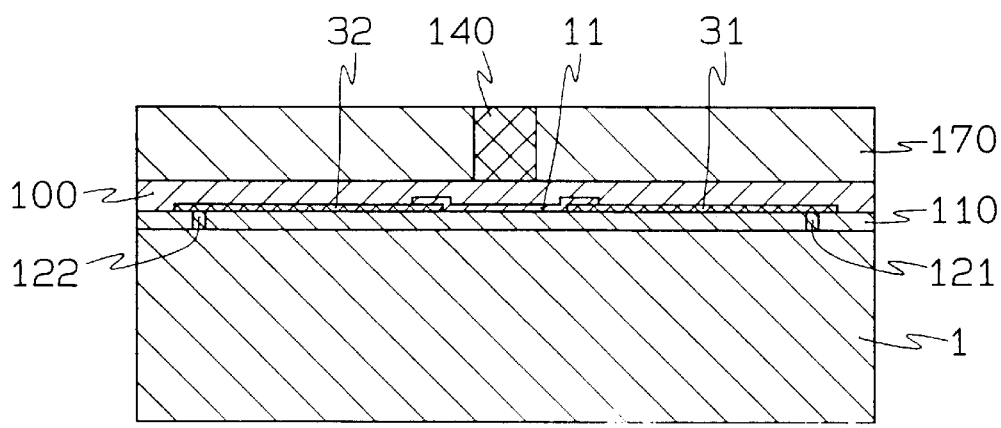
Figure 4C:
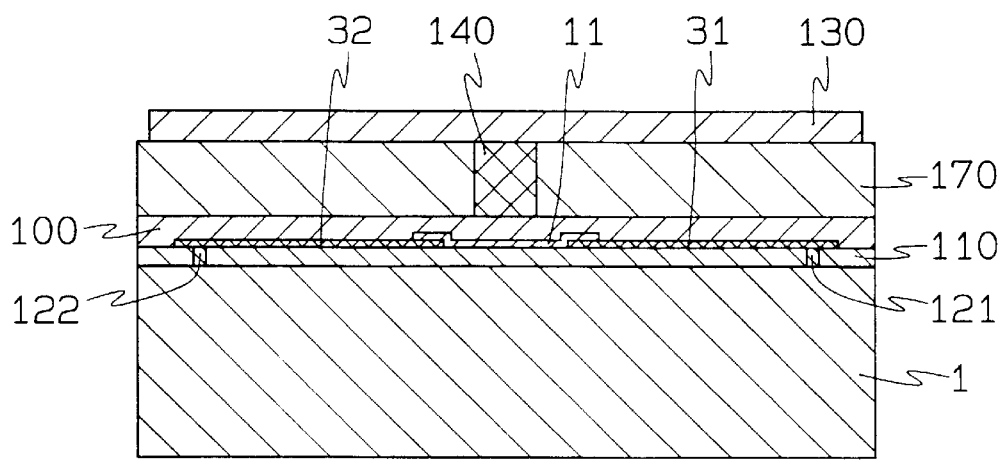

Next, the method for manufacturing the two-dimensional infrared focal plane array in the structure of the embodiment will be described hereinafter. FIGS. 4(*a*) through 4(*c*) and FIGS. 5(*a*) and 5(*b*) are sectional views illustrating the steps for manufacturing one pixel of the two-dimensional infrared focal plane array in the embodiment. Referring to FIG. 4(*a*), a signal readout circuit (not shown) is formed on the silicon substrate 1, and then the insulating film 110, the contact portions 121 and 122 are formed. Then, the metal wirings 31 and 32, and the bolometer thin film 11 are formed. Finally, a condition where the surface is covered with the insulating film (protective insulating film) 100 is shown. The structure described so far can be made easily by using the art used in the general semiconductor manufacturing process.

In FIG. 4(*b*), a sacrifice layer 170 to be removed at a later step is formed on the structure shown in FIG. 4(*a*). A portion for forming a splicing pillar in the sacrifice layer 170 is removed by the photolithography technique so as to bury the removed portion with a material of which the splicing pillar is formed. A material to be used for a sacrifice layer can be any one which is an etchant, in forming the splicing pillar, which is hard to etch the splicing pillar and can be etched easily. When the sacrifice layer is made of the polycrystalline silicon, the silicon dioxide (SiO$_2$) or the like can be provided. Also, the thickness of the sacrifice layer is approximately 1 through 2 μm. In this step, it is desirable to flatten the uppermost surface with the etchback technique or the like so that it is flattened. Before forming the sacrifice layer, the silicon substrate is etched, and an etching window for forming the cavity portion 200 within the substrate is formed with the insulating films 100 and 110 in such a manner as to be partially removed with the photolithography technique.

In FIG. 4(*c*), a thin film which is to be the infrared ray absorbing portion 130 is formed on the structure of FIG. 4(*b*) and is patterned so as to separate the infrared ray absorbing portion for each of the pixels for planar layout shown in FIG. 2.

Figure 5A:
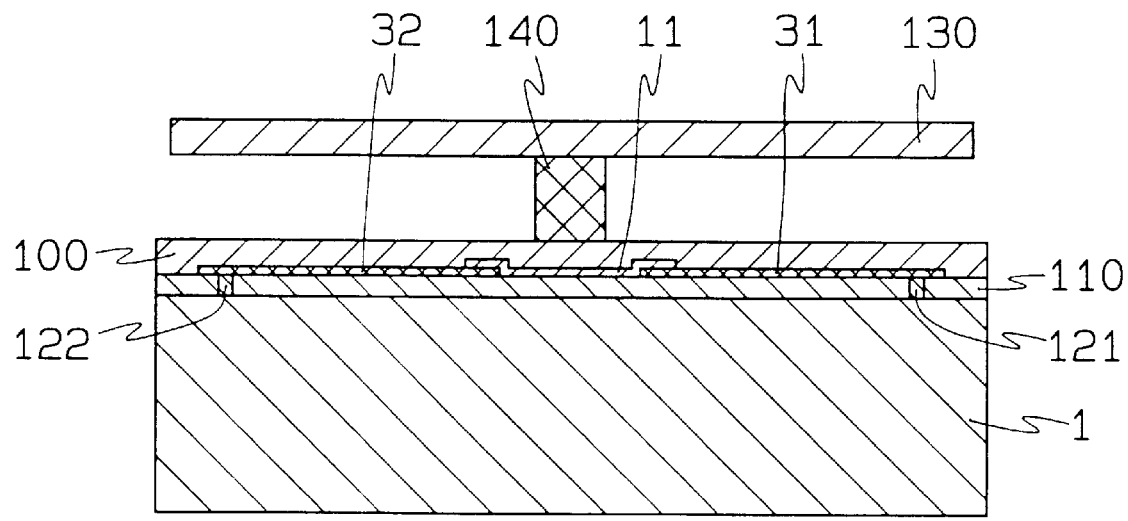
FIGS. 5(a) and 5(b) are cross-sectional views illustrating the process for the pixel in the two-dimensional infrared focal plane array in which a thermal type detector is employed according to an embodiment of the present invention.
Figure 5B:
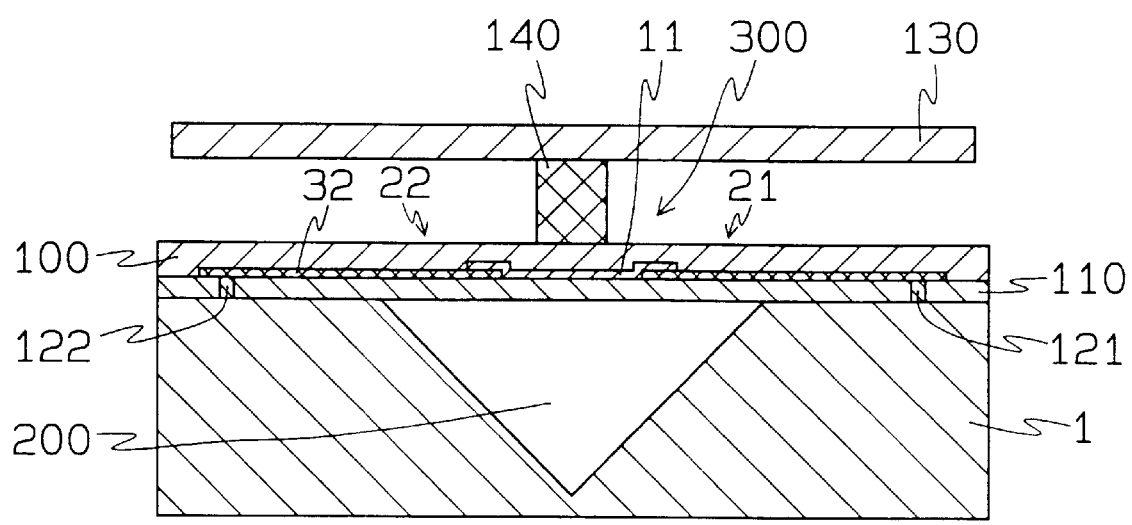

FIG. 5(*a*) shows a condition where the sacrifice layer 170 is etched from the opening portion on the periphery of the infrared ray absorbing portion 130 so as to float the portion under the infrared ray absorbing portion 130 from the silicon substrate 1 with the splicing pillar 140 remaining unchanged.

FIG. 5(*b*) shows one pixel structure of the two-dimensional infrared focal plane array of the invention in the final step as shown in FIG. 1. In the previous step, the silicon surface of the etching hole portion in the silicon substrate described in the step of FIG. 4(*b*) is exposed.

FIG. 5(*b*) shows a condition where the cavity portion 200 is formed in the silicon substrate in such a manner that the silicon substrate is etched from the portion. The anisotropic etching operation can be performed with the delayed etching speed when (111) crystal surface is exposed onto the surface, by using a liquid such as potassium hydroxide (KOH), tetramethyl ammonium hydroxide (TMAH) in the etching of silicon. The sectional cavity portion can be made as shown without being enlarged widely from the constant size of the surface shape of the cavity portion with using the silicon substrate having the (100) crystal face to be generally used in the MOS semiconductor element or the CMOS semiconductor element.

Although one splicing pillar is described in the embodiment, the splicing pillar can be made plural. The same things can be in common about all the embodiments.

Although the position of the splicing pillar when seen in plane is optional, and the infrared ray absorbing portion can be supported in the mechanical structure, a position is desirable where large temperature distribution is not caused in the infrared ray absorbing portion. A position for the slicing pillar for satisfying the conditions is optimum below the position adjacent to the center of gravity of the infrared ray absorbing position. The situation can be applied commonly to all the embodiments shown hereinafter.

The splicing pillar is formed in a shape the cross section of which is a rectangle or a circle. The shape can be optional. The length of the longer side of the rectangle is approximately several micrometers. The diameter of the circle is approximately several micrometers. Hereinafter, the length of the longer side of the rectangle or the diameter of the circle is referred to as a pillar size in cross section. On the other hand, the height of the splicing pillar is referred to as a pillar size in height. The thermal resistance can be designed to be provided which is sufficiently smaller as compared with the thermal resistance of the support legs for thermally coupling the temperature detecting portion with the silicon substrate so that significant difference may not be caused in temperature between the infrared ray absorbing portion and the temperature detecting portion. The same things can be commonly applied to the embodiments shown hereinafter.

Embodiment 2

Figure 6:
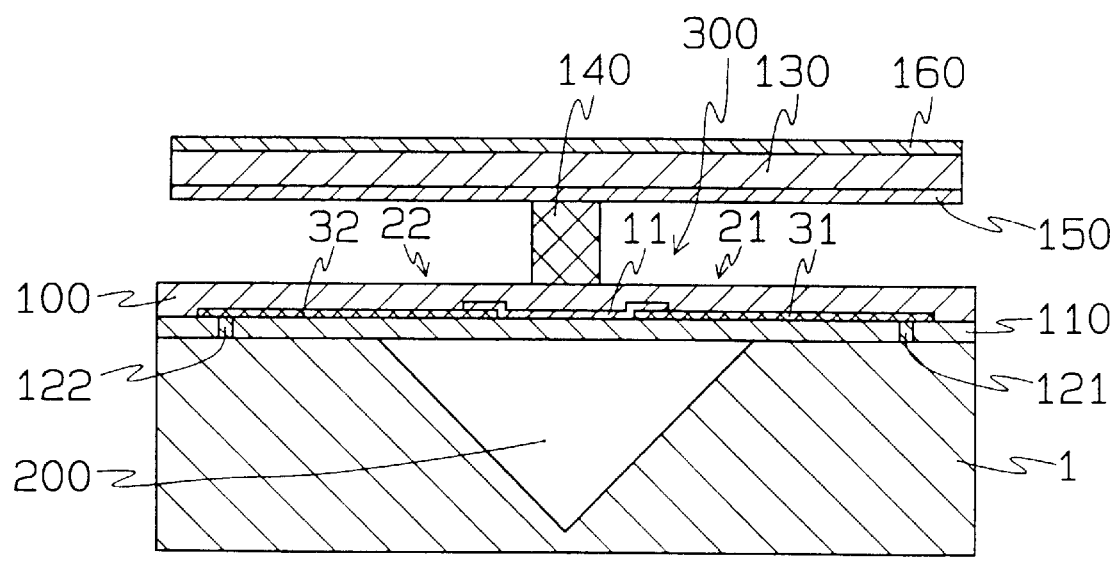
FIG. 6 is a cross-sectional view illustrating the pixel in the two-dimensional infrared focal plane array in which a thermal type detector is employed according to another embodiment of the present invention.

FIGS. 6(a) and 6(b) are each a sectional view of one pixel showing another embodiment of the two-dimensional infrared focal plane array using the thermal type light detector according to the invention. Referring now to the drawings, reference numeral 150 shows a metal reflection film as a reflection film. Reference numeral 160 shows a metal infrared ray absorbing film. In the embodiment, an optical resonant structure is formed as the infrared ray absorbing portion a comprising three-layer structure in such a manner that a thin metal reflection film 150 is provided under the infrared ray absorbing portion 130 and an extremely thin metal infrared ray absorbing film 160 is provided above the infrared adsorbing portion. Although not shown above, the structure can be an infrared ray absorbing one of two layers with the metal reflection film 150 provided under the infrared ray absorbing portion 130. According to the embodiment, the infrared rays can be absorbed efficiently as compared with the pixel of the structure shown in FIG. 1. The metal reflection film 150 is made of aluminum or the like, and is several hundreds nanometers in thickness. The metal infrared ray absorbing film 160 is made of, for example, nickel chromium alloy or the like and is several nanometers in thickness. The sheet resistance is desirable to be approximately 377 Ω. Although not shown, another insulating film can be formed as an interlayer insulating film further under the metal reflection film 150. Still another insulting film may be formed as the interlayer insulating film further under the metal reflection film 150 and on the metal infrared ray absorbing film 160. The other insulating film is suitable which has a function of protecting the metal reflection film 150 in the sacrificing etching operation. For example, silicon dioxide ($SiO_2$) or the like can be used. A position where the infrared ray absorbing structure is provided by the infrared ray absorbing structure of such a two-layer structure or the optical resonant structure of a three-layer structure can be only one portion of the infrared ray absorbing portion. The same thing can be said as in the embodiment, except for provision of the infrared ray absorbing structure or the optical resonant structure in the infrared ray absorbing portion.

Figure 22:
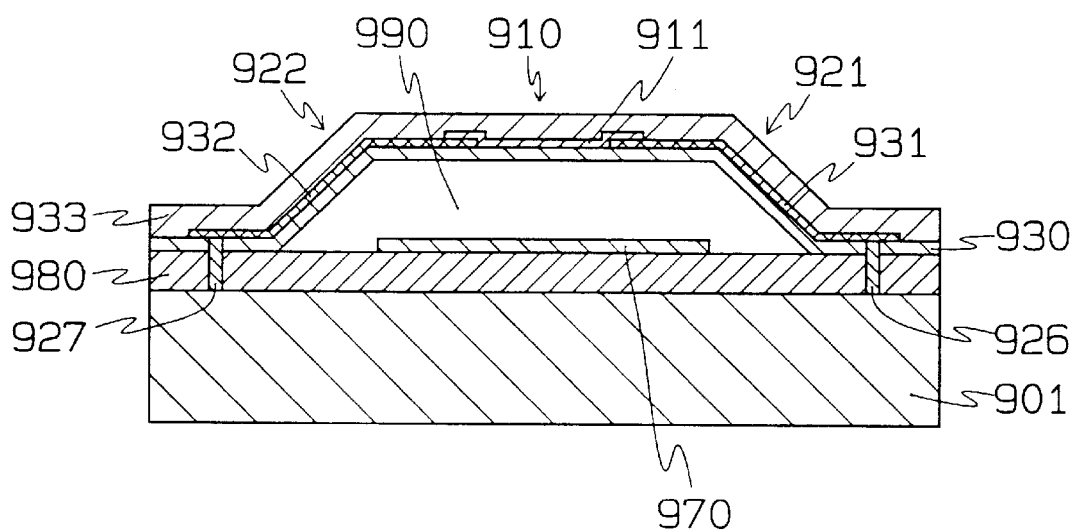
FIG. 22 is a cross-sectional view illustrating the structure of the pixel in the conventional two-dimensional infrared focal plane array in which a thermal type detector is employed.

Even in the conventional embodiment shown in FIG. 22, the optical resonant structure includes the reflection film 970. Although the effect of the optical resonant structure depends upon the distance between the reflection film and the absorber, it is difficult to control the effect of the infrared ray absorption caused by the optical resonant structure, because in the conventional system, the distance becomes one between the metal reflection film 970 and the infrared ray detector portion 910 and the support legs can be deformed due to the inner stress of the film. On the other hand, in the structure shown in FIG. 6, the effect of the infrared ray absorption by the optical resonant structure is easy to control, because the effect is dependent upon the film thickness of the infrared ray absorbing portion 130 and the film thickness of the metal infrared ray absorbing film 160.

Embodiment 3

Figure 7:
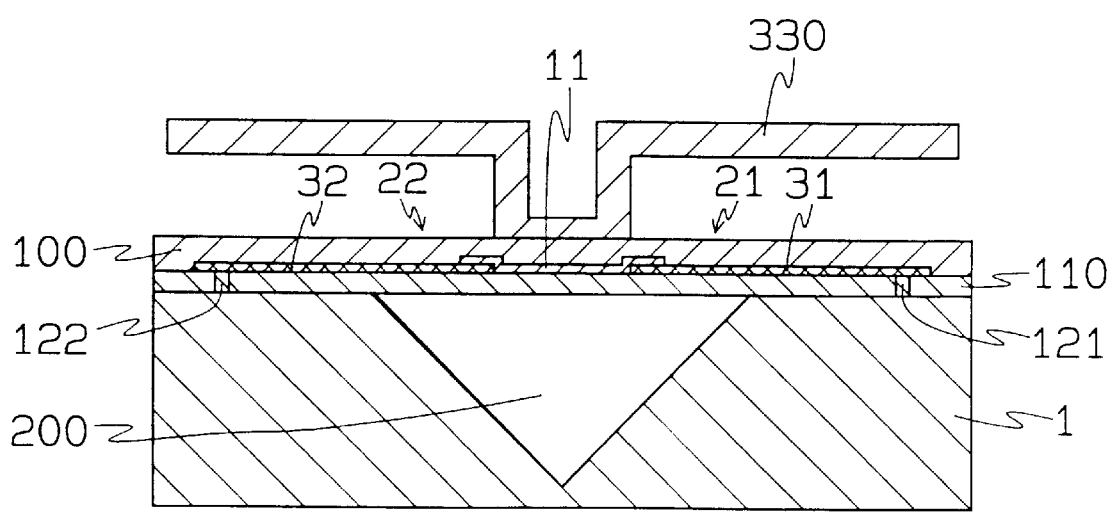
FIG. 7 is a cross-sectional view illustrating the pixel in the two-dimensional infrared focal plane array in which a thermal type detector is employed according to another embodiment of the present invention.

FIG. 7 is a sectional view illustrating the sectional structure of one pixel of the two-dimensional infrared focal plane array in which the thermal optical detector in another embodiment of the invention is employed. In FIG. 7, reference numeral 330 shows an infrared ray absorbing portion where the splicing pillar in the embodiment 1 is formed in one body with the same components as those of the infrared ray absorbing portion. In the embodiment, instead of the splicing pillar 140 shown in FIG. 1, the splicing between the infrared ray absorbing portion and the temperature detecting portion is composed of a structure formed in one body with the infrared ray absorbing portion 330. The splicing pillar is the same as in the embodiment 1, except that the structure is formed in one body with the infrared ray absorbing portion.

Figure 8:
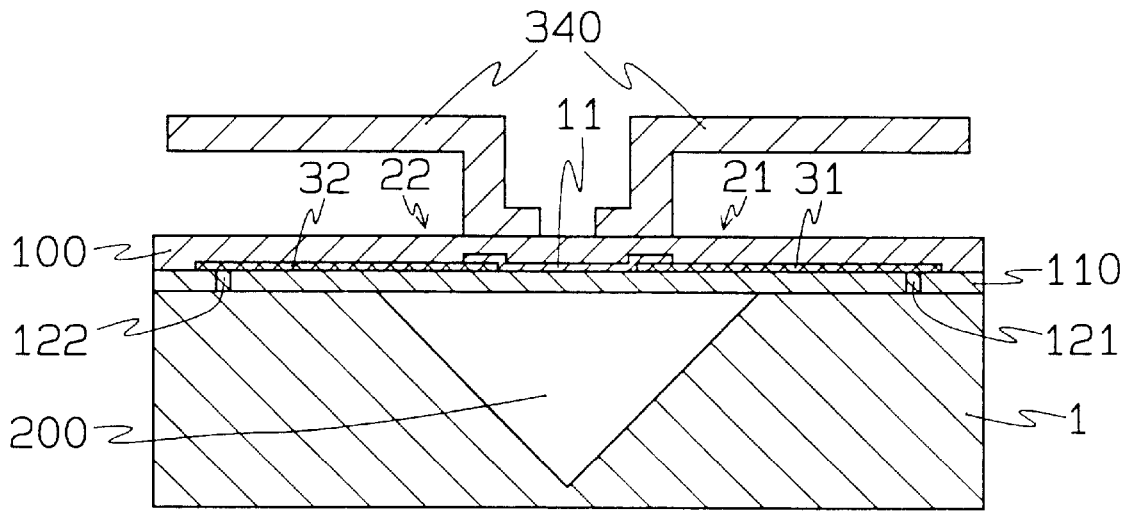
FIG. 8 is a cross-sectional view illustrating the pixel in the two-dimensional infrared focal plane array in which a thermal type detector is employed according to another embodiment of the present invention.

FIG. 8 is a sectional view illustrating the embodiment with one portion of the infrared ray absorbing portion 330 shown in FIG. 7 being removed. Referring to the drawing, reference numeral 340 shows an infrared ray absorbing portion having a central portion in contact with the temperature detecting portion of the infrared ray absorbing portion 330 in the embodiment 2. Removing part of this central portion to form a gap can be performed by a photolithography technique. In this structure, the thermal capacity of the infrared ray absorbing portion can be reduced because of this gap in the central portion of the infrared ray absorbing portion in contact with the temperature detecting portion 300.

Embodiment 4

Figure 9:
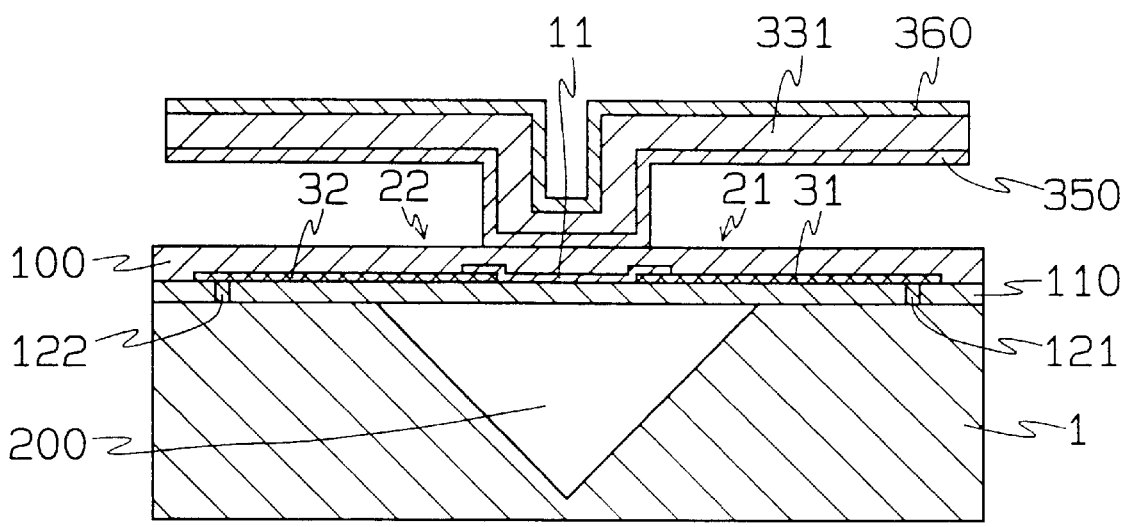
FIG. 9 is a cross-sectional view illustrating the pixel in the two-dimensional infrared focal plane array in which a thermal type detector is employed according to another embodiment of the present invention.

FIG. 9 is a sectional view illustrating one pixel of the two-dimensional infrared focal plane array in which the thermal type light detector in another embodiment of the invention is employed. Referring to FIG. 9, reference numeral 331 shows an infrared ray absorbing portion. Reference numeral 350 shows a metal reflection film. Reference numeral 360 shows a metal infrared ray absorbing film. The same item shown in the embodiment 2 and the embodiment 3 can be used for the metal reflection film and the metal infrared ray absorbing film. In the embodiment 4, the splicing operation of the infrared ray absorbing portion 130, the metal reflection film 150 and the metal infrared ray absorbing film 160 and the temperature detecting portion 300 in the embodiment 2 is constructed through a structure formed in one body with the use of the infrared ray absorbing portion, the metal reflection film and the metal infrared ray absorbing film, instead of the splicing pillar 140 shown in FIG. 6. Namely, at least one portion of the splicing pillar is formed of the same material as that of the infrared ray absorbing portion. The embodiment is the same as in the other embodiments 1 through 3 with the exception that the optical resonant structure is provided in the infrared ray absorbing portion and the splicing pillar is composed of the structure in one body with the one body structure between the infrared ray absorbing portion and the optical resonant structure. The infrared ray absorbing portion 331, the metal reflection film 350 and the metal infrared ray absorbing film 360 can be formed into the structure in one body by the CVD method or a sputter method. Even in the structure, the center of the temperature detecting portion can be exposed with the infrared ray absorbing portion 331 in contact with the temperature detecting portion 300, the metallic reflection film 350 and the metal infrared ray absorbing film 360 partially removed as shown in the embodiment 3. Although not shown, another insulating film (interlayer insulating film) can be formed under the metal reflection film 350 and on the metal infrared ray absorbing film 360. Also, a position where the absorbing structure of the infrared ray by the optical resonant structure having a three-layer structure can be provided with only one portion in the infrared ray absorbing portion as shown in the embodiment 2.

Embodiment 5

Figure 10:
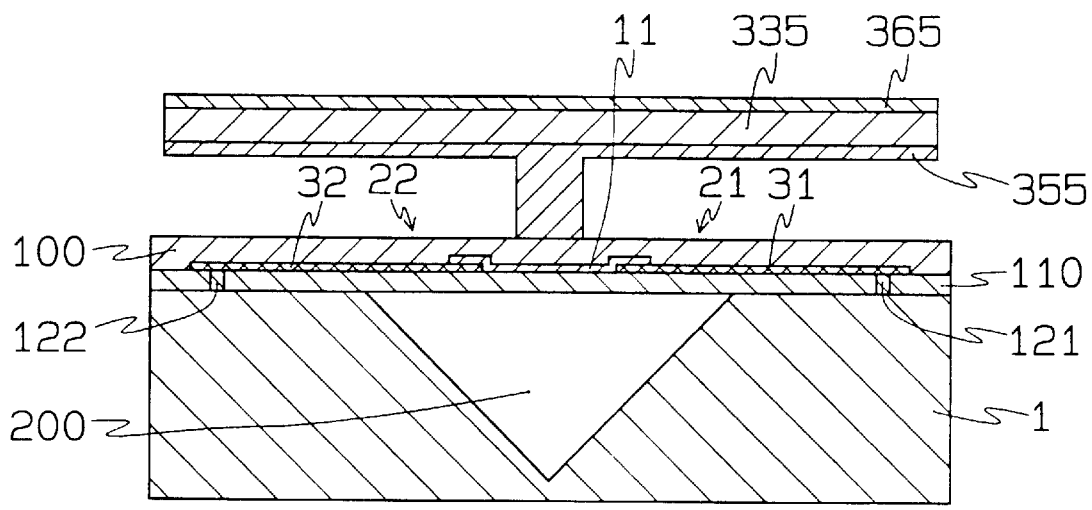
FIG. 10 is a cross-sectional view illustrating the pixel in the two-dimensional infrared focal plane array in which a thermal type detector is employed according to another embodiment of the present invention.

FIG. 10 is a sectional view illustrating one pixel of the two-dimensional infrared focal plane array where the material of the splicing pillar in the embodiment 2 is changed. In FIG. 10, reference numeral 335 shows an infrared ray absorbing portion. Reference numeral 355 shows a metal reflection film. Reference numeral 365 shows a metal infrared ray absorbing film with the splicing pillar formed in one body as one body structure with the metal reflection film 355. In this case, the metal reflection film 355 is desirably to be aluminum which is a material having the strength necessary to support the infrared ray absorbing portion. Also, the pillar size in cross section is desirably several micrometers and the pillar size in height is desirably 1 through 2 μm. In the embodiment, to form as one body structure with the splicing pillar and the metal reflection film, the portion for forming the splicing pillar of the sacrifice layer is removed with the photolithography technique. After the removed portion is filled with aluminum, i.e., a material for forming the metal reflection film, the metal reflection film is formed continuously. The manufacturing step can be simplified by the formation in this manner.

Embodiment 6

Figure 11:
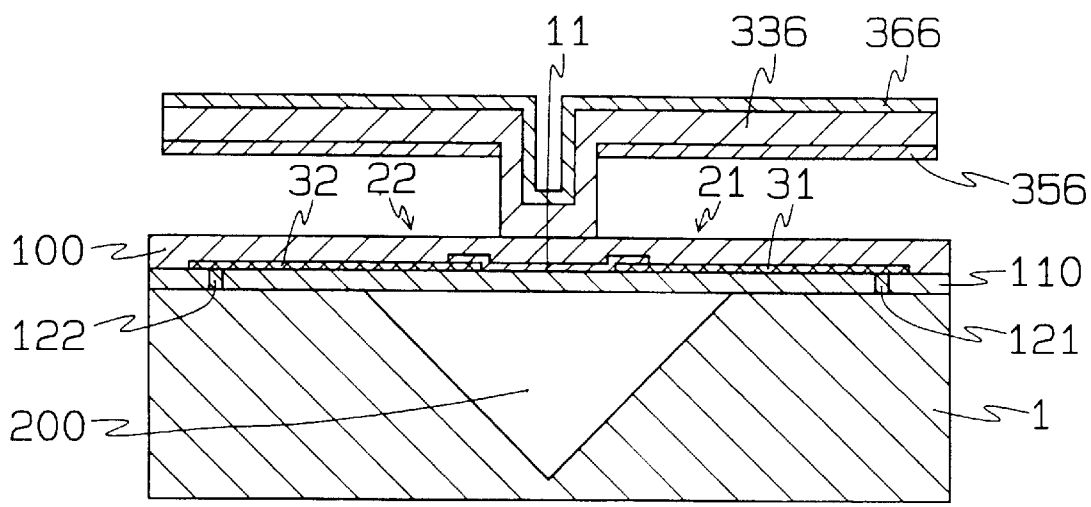
FIG. 11 is a cross-sectional view illustrating the pixel in the two-dimensional infrared focal plane array in which a thermal type detector is employed according to another embodiment of the present invention.

FIG. 11 is a sectional view illustrating one pixel of the two-dimensional focal plane array where the metal reflection film is provided only under the infrared ray absorbing portion with the shape of the splicing pillar changed relative to that in the embodiment 4. In FIG. 11, reference numeral 336 shows an infrared ray absorbing portion. Reference numeral 356 shows a metal reflection film. Reference numeral 366 shows a metal infrared ray absorbing film with the splicing pillar being formed of the same components as those of the infrared ray absorbing portion and the metal infrared ray absorbing film. Namely, at least one portion of the splicing pillar is formed of the same components as those of the infrared ray absorbing portion. In this case, to obtain the strength necessary for supporting the infrared ray absorbing portion, silicon dioxide (SiO₂) or silicon nitride (SiN) or a laminated film comprising them is desirable as the material used for the infrared ray absorbing portion. Also, the pillar size in cross section is desirably several micrometers and the pillar size in height is desirably 1 through 2 μm. In the embodiment, to form the splicing pillar with the same components as those of the infrared ray absorbing portion and the metal infrared ray absorbing film, the portion for forming the splicing pillar, of the sacrifice layer, is removed with the photolithography technique. The metal reflection film and the metal infrared ray absorbing film are formed on the removed portion and the sacrifice layer after the metal reflection film has been formed on the sacrifice layer except for the removed portion. The manufacturing step can be simplified by the formation in this manner.

Embodiment 7

Figure 12:
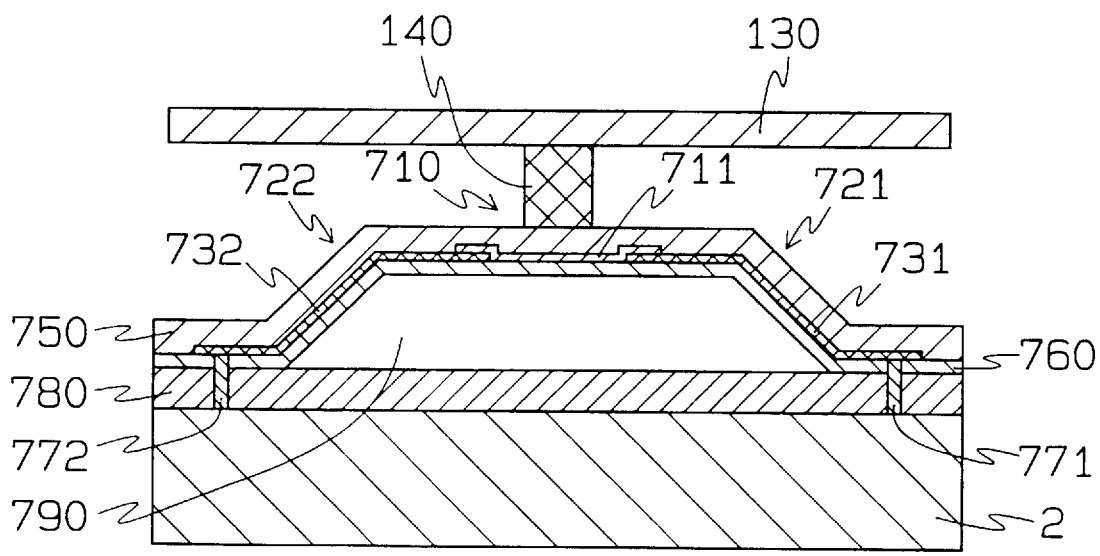
FIG. 12 is a cross-sectional view illustrating the pixel in the two-dimensional infrared focal plane array in which a thermal type detector is employed according to another embodiment of the present invention.

FIG. 12 is a sectional view illustrating one pixel of the two-dimensional infrared focal plane array using the thermal type light detector according to another embodiment of the invention. A signal readout circuit provided on the silicon substrate, which is not related directly to the invention is omitted for simplification. In FIG. 12, reference numeral 2 shows a silicon substrate as the semiconductor substrate. Reference numeral 710 shows a temperature detecting portion. Reference numeral 711 shows a bolometer thin film as the temperature detecting element for detecting the temperature change. Reference numerals 721 and 722 show support legs. The support legs are provided on the cavity portion 790 formed on the silicon substrate 2 and float the temperature detecting portion 710 including the bolometer thin film. The temperature detecting portion is formed to be positioned above the readout circuit formed on the silicon substrate. Reference numerals 731 and 732 show metal wirings and the metal wirings connect the bolometer thin film 711 with the readout circuit. Reference numeral 750 shows an insulating film (protective insulating film). Reference numeral 760 shows an insulating film. Two insulating films are composed of silicon dioxide film and silicon nitride film which are large in thermal resistance. The two insulating films support the temperature detecting portion by composing the mechanical structure, i.e. the support legs 721, 722 and the temperature detecting portion 710. Reference numerals 771 and 772 show contact portions for connecting metal wirings 731, 732 and the signal readout circuit. Reference numeral 130 shows an infrared ray absorbing portion for absorbing the infrared rays and converting them into heat. Reference numeral 140 shows a splicing pillar. The splicing pillar maintains the infrared ray absorbing portion away from the temperature detecting portion 710 and also, couples the infrared ray absorbing portion 130 with the temperature detecting portion 710 thermally. Reference numeral 780 shows an insulating film. Reference numeral 790 shows a cavity portion formed on the silicon substrate 2. The material and the forming method to be used for respective portions are the same as in the embodiments 1 through 6. The readout circuitry is the same as in the embodiments 1 through 6 in that it is composed of metal wiring, signal readout circuit and contact portion. Also, the temperature detecting portion 710 is composed of two insulating films 750, 760, and the bolometer thin film 711. The bolometer thin film is the same as in the embodiments 1 through 6 even in that the bolometer thin film is supported as the mechanical structure body by the structure where the insulating film 750 is provided on it and the insulating film 760 is provided under it. Two-dimensional infrared focal plane array in this embodiment is in structure where the infrared ray absorbing portion 130 is provided shown in the embodiment through the splicing pillar 140 on the structure except for the metal reflection film 970, of the structure of the conventional two-dimensional infrared focal plane array shown in FIG. 22, with the same structure as in the embodiments 1 through 6. To form the infrared ray absorbing portion and the splicing pillar, the same operation can be performed as in the embodiment 1.

Embodiment 8

Figure 13:
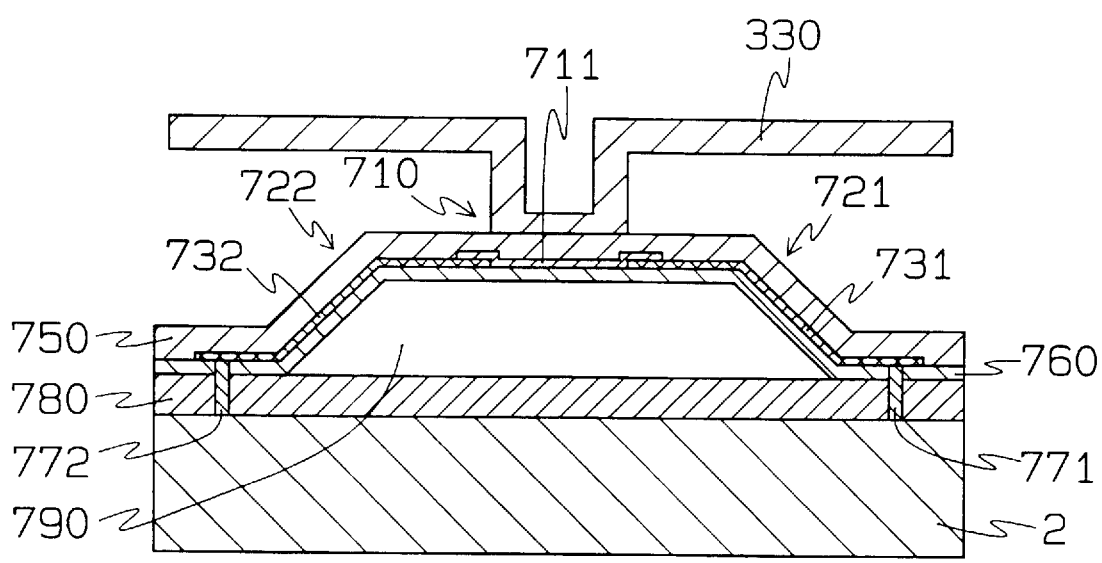
FIG. 13 is a cross-sectional view illustrating the pixel in the two-dimensional infrared focal plane array in which a thermal type detector is employed according to another embodiment of the present invention.

FIG. 13 is a sectional view illustrating one pixel of the two-dimensional infrared focal plane array in which the thermal type light detector according to another embodiment of the invention is employed. The two-dimensional infrared focal plane array in this embodiment is constructed so that the infrared ray absorbing portion 330 of structure in one body where the splicing pillar between the infrared ray absorbing portion 130 and the temperature detecting portion 300 is formed in one body with the same components as those of the infrared ray absorbing portion 130, instead of the splicing pillar 140 shown in FIG. 12, on the structure (except for the metal reflection film 970) of the conventional two-dimensional infrared focal plane array shown in FIG. 22, with the other structure being the same as that of the embodiment 7. To form the splicing pillar into structure in one body with the infrared ray absorbing portion, the operation can be effected as in the embodiment 3.

Embodiment 9

Figure 14:
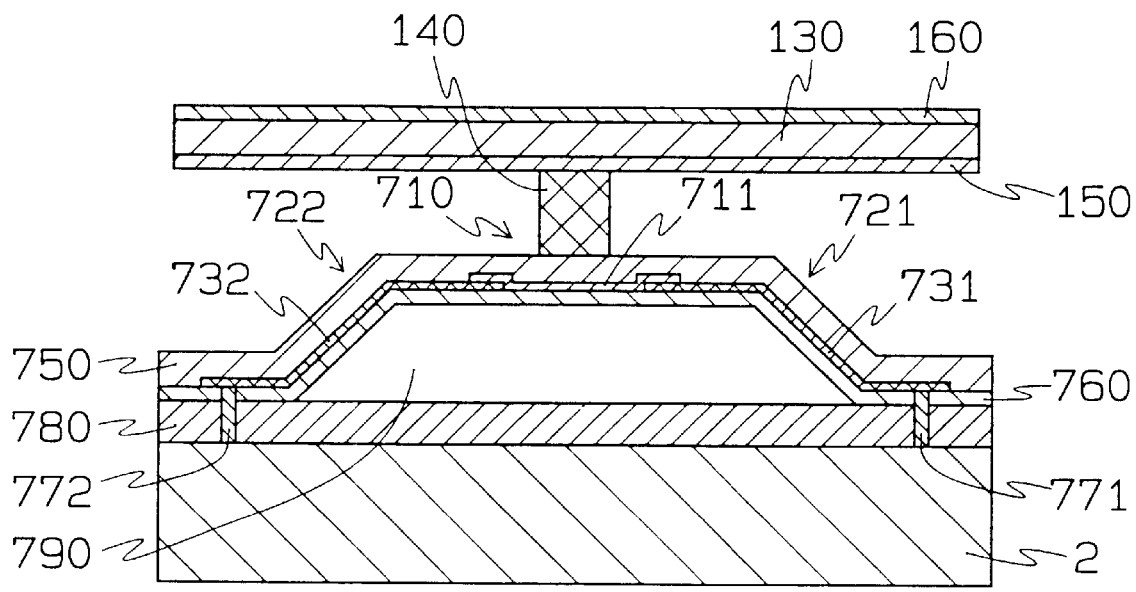
FIG. 14 is a cross-sectional view illustrating the pixel in the two-dimensional infrared focal plane array in which a thermal type detector is employed according to another embodiment of the present invention.

FIG. 14 is a sectional view illustrating one pixel in the two-dimensional infrared focal plane array in which a thermal type light detector according to another embodiment of the invention is employed. The two-dimensional infrared focal plane array according to the embodiment is constructed to form the optical resonant structure as the infrared ray absorbing portion of a three-layer structure with the infrared ray absorbing portion 130, the metal reflection film 150 and the metal infrared ray absorbing film 160 provided through the splicing pillar 140 and the splicing pillar on the structure of the conventional two-dimensional infrared focal plane array shown in FIG. 22. Also, although not shown, the metal reflection film 150 can be made into an infrared ray absorbing portion of two-layer under the infrared ray absorbing portion 130. It is the same as the embodiment 6 with the exception that the infrared ray absorbing portion has the infrared ray absorbing structure or the optical resonant structure. Although not shown, another insulating film may be formed under the metal reflection film 150 of the infrared ray absorbing structure or another insulating film may be formed under the metal reflection film 150 of the optical resonant structure and on the metal infrared ray absorbing film 160. Also, a position where the absorbing structure of the infrared ray is provided by the infrared ray absorbing structure comprising a two-layer structure or the optical resonant structure comprising a three-layer structure can be provided as only one portion of the infrared ray absorbing portion.

Embodiment 10

Figure 15:
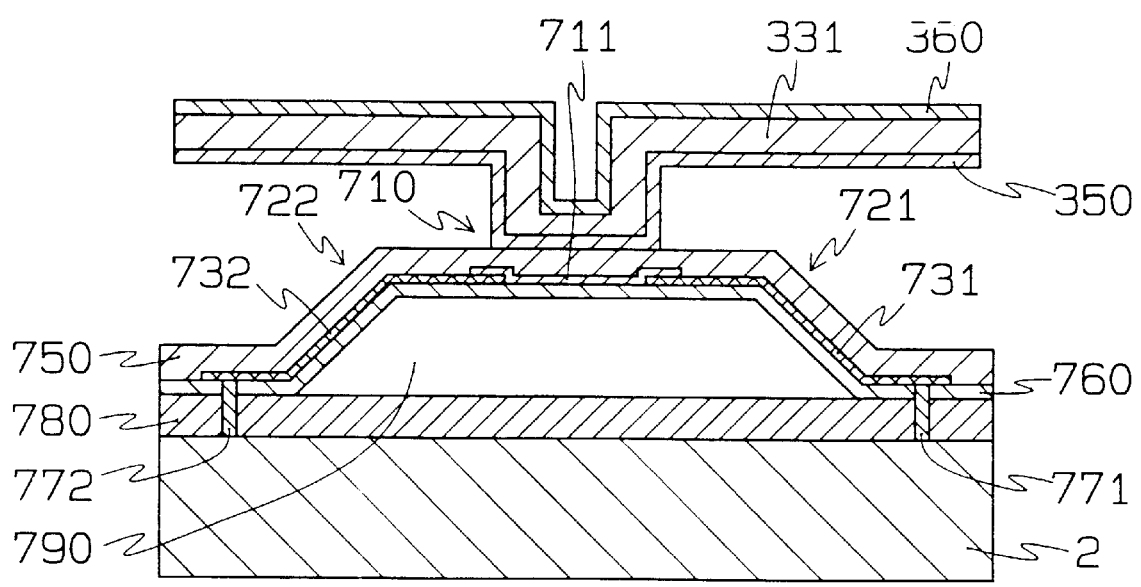
FIG. 15 is a cross-sectional view illustrating the pixel in the two-dimensional infrared focal plane array in which a thermal type detector is employed according to another embodiment of the present invention.

FIG. 15 is a sectional view illustrating one pixel of the two-dimensional infrared focal plane array in which a thermal type light detector according to another embodiment of the invention is employed. The two-dimensional infrared focal plane array according to the embodiment is the one body structure where the infrared ray absorbing portion 331, the metal reflection film 350 and the metal infrared ray absorbing film 360 are formed in one body on the structure (except for the metal reflection film 970) of the conventional two-dimensional infrared focal plane array shown in FIG. 22. At least one portion of the splicing pillar is formed of the same material as that of the infrared ray absorbing portion and the infrared ray absorbing portion with the optical resonant structure attached to it, composed of the metal reflection film 350 and the metal infrared ray absorbing film 360, with other structure which is the same as that of the embodiment 9. Also, although not shown, another insulating film may be formed under the metal reflection film 350 and on the metal infrared ray absorbing film 360. Also, a position where the absorbing structure of the infrared ray by the optical resonant structure of a three-layer structure can be provided as only one portion of the infrared ray absorbing portion. Also, in this embodiment, one portion in the infrared ray absorbing portion in contact with temperature detecting portion can be removed to reduce thermal capacity of the infrared ray absorbing portion, as is the case with FIG. 8 of Embodiment 3.

Embodiment 11

Figure 16:
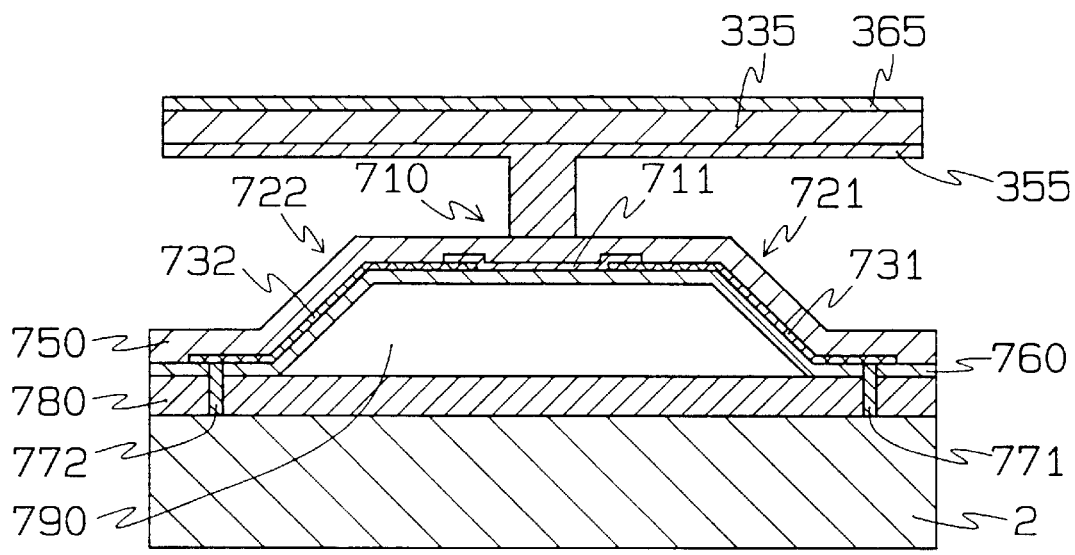
FIG. 16 is a cross-sectional view illustrating the pixel in the two-dimensional infrared focal plane array in which a thermal type detector is employed according to another embodiment of the present invention.

FIG. 16 is a sectional view illustrating one pixel of the two-dimensional infrared focal plane array with the material of the splicing pillar in the embodiment 9 being changed. Referring to FIG. 16, the metal reflection film 355 is formed as one body structure with the splicing pillar on the conventional two-dimensional infrared focal plane array (except for the metal reflection film 970) shown in FIG. 22. The method of forming it in this manner is the same as that of the embodiment 5 with other structure being the same as in the embodiment 9. Although not shown, another insulating film can be formed under the metal reflection film 355 and on the metal infrared ray absorbing film 365. Also, a position where the absorbing structure of the infrared ray by the optical resonant structure of a three-layer structure can be provided as only one portion of the infrared ray absorbing portion. Also, in this embodiment, one portion in the infrared ray absorbing portion in contact with the temperature detecting portion can be removed to reduce thermal capacity of the infrared ray absorbing portion, as is the case with FIG. 8 of Embodiment 3.

Embodiment 12

Figure 17:
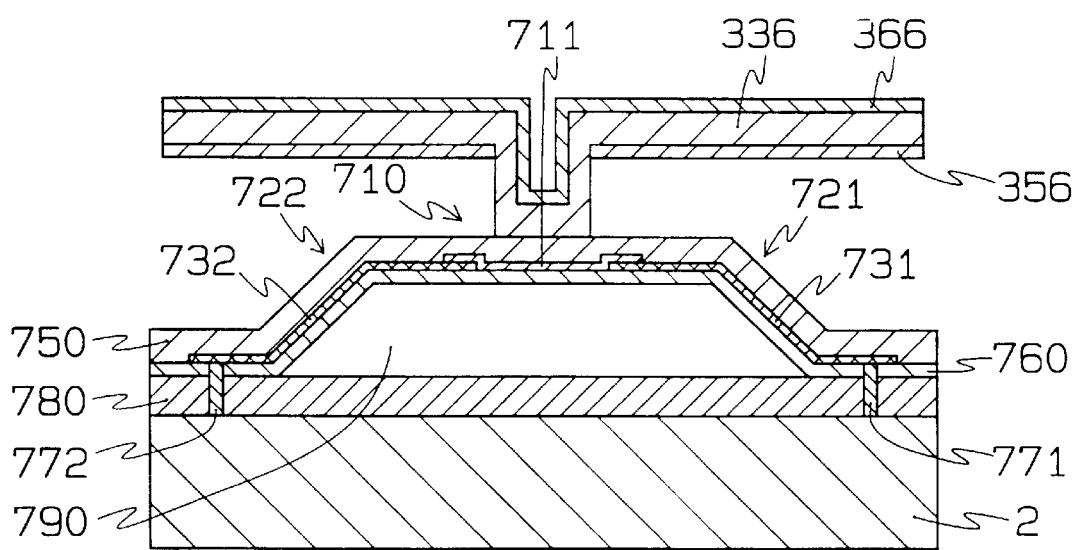
FIG. 17 is a cross-sectional view illustrating the pixel in the two-dimensional infrared focal plane array in which a thermal type detector is employed according to another embodiment of the present invention.

FIG. 17 is a sectional view illustrating one pixel of the two-dimensional infrared focal plane array where the metal reflection film 356 is provided under the infrared ray absorbing portion with the shape of the splicing pillar in the embodiment 10 being changed. Referring to FIG. 17, the splicing pillar is formed of the same components as those of the infrared ray absorbing portion and the metal infrared ray absorbing film 366. Namely, at least one portion of the splicing pillar is formed with the same material as that of the infrared ray absorbing portion. The method of forming it in this manner is the same as that of the embodiment 5 with other structure being the same as in the embodiment 10. Although not shown, another insulating film can be formed under the metal reflection film 356 and on the metal infrared ray absorbing film 366. Also, a position where the absorbing structure of the infrared ray by the optical resonant structure of a three-layer structure can be provided as only one portion of the infrared ray absorbing portion.

Embodiment 13

Figure 18:
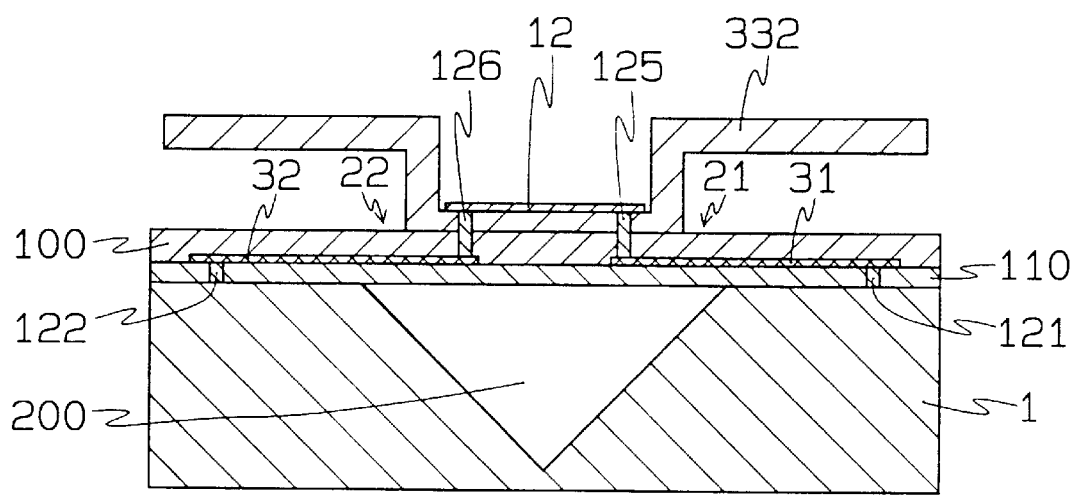
FIG. 18 is a cross-sectional view illustrating the pixel in the two-dimensional infrared focal plane array in which a thermal type detector is employed according to another embodiment of the present invention.

FIG. 18 is a sectional view illustrating one pixel of the two-dimensional infrared focal plane array according to the embodiment with the position of the bolometer thin film of the embodiment shown in FIG. 7 being changed. Referring to the drawing, reference numeral 12 shows a bolometer thin film as a temperature detecting element. Reference numerals 125 and 126 show contact portions. Reference numeral 332 shows an infrared ray absorbing portion formed as structure in one body as the splicing pillar. Referring to the embodiment, instead of a splicing pillar 140 as in the embodiment shown in FIG. 7, the splicing between the infrared ray absorbing portion 332 and the temperature detecting portion 300 is constructed as one body structure, with the splicing pillar being formed in one body with the same components as those of the infrared ray absorbing portion 332. The bolometer thin film 12 is formed on the upper surface of the infrared ray absorbing portion 332 and is connected with the metal wiring 31 with contact portion 125, and is connected with the metal wiring 32 by the contact portion 126. The embodiment is the same as in the embodiment 3 with the exception that the bolometer thin film 12 is formed on the upper surface of the infrared ray absorbing portion.

Even in this structure, one portion of the infrared ray absorbing portion 332 in contact with the temperature detecting portion 300 can be removed.

Embodiment 14

Figure 19:
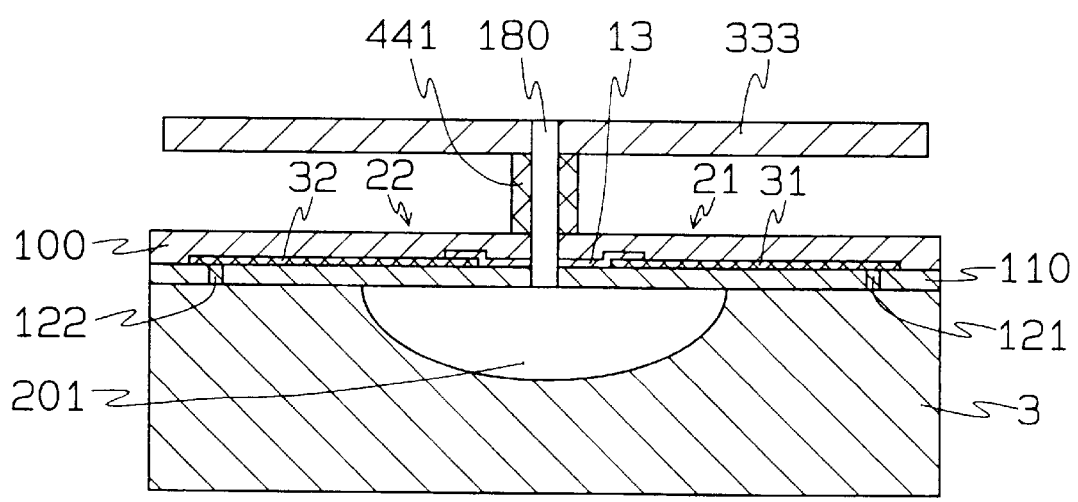
FIG. 19 is a cross-sectional view illustrating the pixel in the two-dimensional infrared focal plane array in which a thermal type detector is employed according to another embodiment of the present invention.

FIG. 19 is a sectional view illustrating one pixel of the two-dimensional infrared focal plane array when an isotropic etching operation is adopted as an etching method for a silicon substrate. Referring to the drawing, reference numeral 3 shows a silicon substrate as a semiconductor substrate. Reference numeral 13 shows a bolometer thin film as a temperature detecting element. Reference numeral 180 shows an etching hole. Reference numeral 201 shows a cavity portion. Reference numeral 333 shows an infrared ray absorbing portion. Reference numeral 441 shows a splicing pillar. Even in this embodiment, the material and the forming method to be used for forming the respective portions are the same as in the embodiment 1. In this embodiment, an etching hole 180 is provided with respect to the silicon substrate in a portion positioned approximately near the center of the cavity portion for forming within the silicon substrate. The etching hole 180 is approximately several micrometers in diameter and penetrates to the cavity portion 201 from the infrared ray absorbing portion 333. When etching the silicon through the etching hole 180 before the sacrifice layer 170 shown in FIG. 4 is removed, isotropic etching is performed as shown in the drawing, and the cavity portion 201 is formed as shown. The isotropic operation can be performed through anisotropic etching by potassium hydroxide and tetramethyl ammonium hydroxide. FIG. 19 is a sectional view illustrating the structure where an etching hole is provided in accordance with FIG. 1. It is possible to change the structure through provision of the same etching hole with respect to the structure shown in FIG. 6, FIG. 7, and FIG. 8. Although an etching hole 180 is formed through the splicing pillar 140 in the structure shown in FIG. 19, the etching hole is not required to extend through the splicing pillar 140. For example, it can be provided except at the location where the support legs are provided. Also, a plurality of etching holes can be provided near the center of the cavity portion 201. In this case, the sacrifice layer 170 can be removed after the formation of the cavity portion within the substrate, thus allowing wide selection in the manufacturing step.

Embodiment 15

Figure 20:
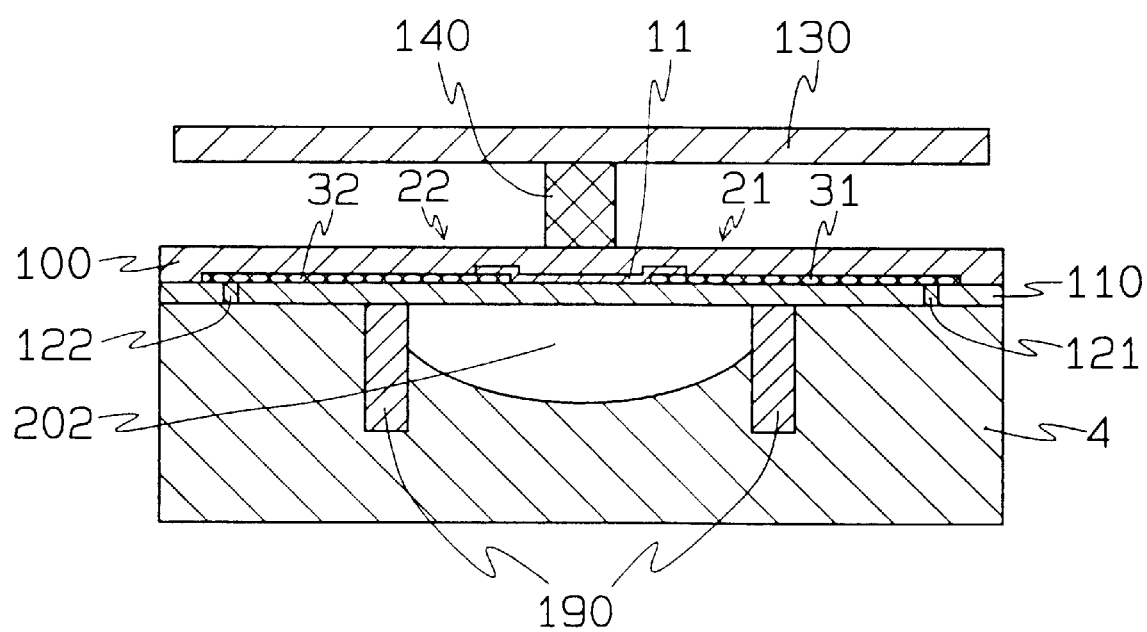
FIG. 20 is a cross-sectional view illustrating the pixel in the two-dimensional infrared focal plane array in which a thermal type detector is employed according to another embodiment of the present invention.
Figure 21:
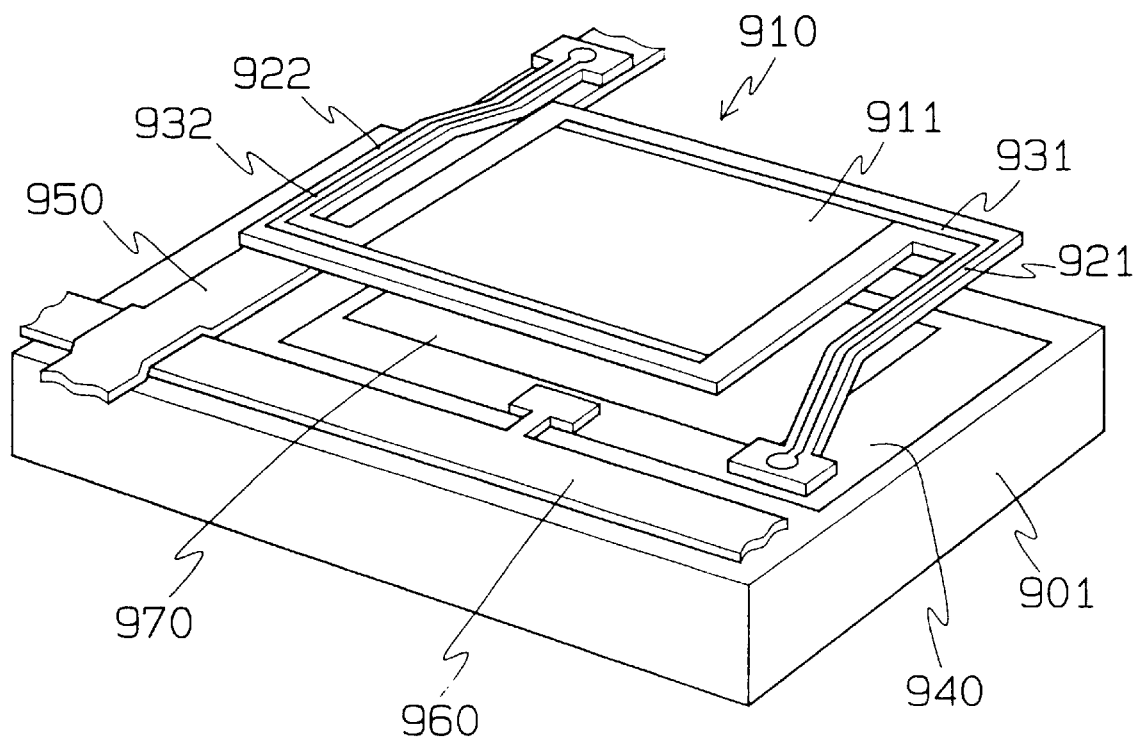
FIG. 21 is a perspective view illustrating the structure of the pixel in the conventional two-dimensional infrared focal plane array in which a thermal type detector is employed.

FIG. 20 is a sectional view illustrating the structure when an isotropic etching is adopted as the etching method for the silicon substrate. Referring to the drawing, reference numeral 4 shows a silicon substrate as a semiconductor substrate. Reference numeral 190 shows an etching stop layer. Reference numeral 202 shows a cavity portion. As shown in the drawing, an etching stop layer 190 is formed to stop the etching on the periphery of the cavity portion 202. As a material for forming the etching stop layer 190 and as a material resistant to the etchant to be used in the formation of the cavity portion, a silicon film oxide and a p-doped impurity layer of the high density formed by ion implanting can be used and can be filled into the silicon substrate during the step of providing the readout circuit.

Although a bolometer thin film is used as the temperature detecting element for detecting the temperature change in all the embodiments shown so far, the invention can obtain the same effect even when the aforementioned pyroelectric body, thermopile or the like are used to detect the temperature change.

Among the embodiments, the most preferred embodiment for practical use is the one in which the infrared ray absorbing portion and the temperature detecting portion are formed in accordance with the embodiment 1 or 11 with respective layers different from each other. In such a most preferred embodiment, the infrared ray absorbing portion is composed of a material capable of absorbing the infrared rays. It is composed of silicon dioxide ($SiO_2$) or silicon nitride formed by the CVD method or laminated films thereof. The splicing pillar can be made of silicon dioxide, silicon nitride and laminated films of these compositions by the CVD method to provide a mechanical structure of sufficient strength and small thermal capacity. In the temperature detecting element, the bolometer thin film is desirable. Vanadium oxide, polycrystalline silicon or amorphous silicon can be used as the material for the bolometer thin film. These materials have a large resistance temperature coefficient and are advantageous for realization of higher sensitivity.

An area of the infrared ray absorbing portion at this time is 48 $\mu$m, wherein the size of the pixel is 50 $\mu$m, and the width of the patterning operation of the infrared ray absorbing portion by photolithography is 2 $\mu$m. The fill factor becomes extremely large at 92% as compared with the conventional structure so that higher sensitivity can be achieved.

In the invention, the infrared ray absorbing portion and the temperature detecting portion are formed as different layers as described above, and the splicing pillar is provided by means of mechanically and thermally coupling the infrared ray absorbing portion and the temperature detecting portion. Therefore, the infrared ray absorbing portion can be designed independently from the designing of the temperature detecting portion, thus realizing a higher fill factor and higher sensitivity.

The two-dimensional infrared focal plane array according to the invention is supported with support legs made of a material, larger in thermal resistance, for controlling the outward flow of the heat into the semiconductor substrate. The temperature detecting portion including the temperature detecting element and the infrared ray absorbing portion having the temperature detecting portion connected through at least one splicing pillar are provided on the semiconductor substrate. Since the splicing pillar is provided by means of mechanically and thermally coupling the temperature detecting portion, the infrared ray absorbing portion can be designed independently of the designing of the temperature detecting portion, so that a higher fill factor and the higher sensitivity can be realized.

Since the temperature detecting portion is provided on the cavity portion formed in the semiconductor substrate, higher sensitivity with large thermal resistance can be realized.

Since the two-dimensional infrared focal plane array according to the invention has the infrared ray absorbing structure comprising a reflection film and interlayer insulting film provided on at least one part of the infrared ray absorption portion, the absorption of the infrared rays is easy to control, with an effect of absorbing the infrared ray more effectively for higher sensitivity.

Since the two-dimensional infrared focal plane array according to the invention has an optical resonant structure comprising a reflection film, an interlayer insulating film and a metal infrared ray absorbing film provided on at least one part of the infrared ray absorbing portion, the absorption of the infrared ray is easier to control and the infrared rays can be absorbed much more efficiently with higher sensitivity.

Since at least one portion of the splicing pillar is made of the same material as the infrared ray absorbing portion, manufacturing can be simplified.

An optical resonant structure comprising the reflecting film, the interlayer insulating film and the metal infrared ray absorbing film is provided on at least one portion of the infrared ray absorbing portion, and the splicing pillar is formed in one body with the metal infrared ray absorbing film, so that manufacturing can be simplified.

Since at least one part of the splicing pillar is formed of the same components as the infrared ray absorbing portion, the portion being in contact with the temperature detecting portion, of the infrared ray absorbing portion is removed, higher sensitivity through reduction in the thermal capacity of the infrared ray absorbing portion can be obtained.

Since in the two-dimensional infrared focal plane array according to the invention, the etching hole penetrating from the infrared ray absorbing portion to the cavity portion is provided in the vicinity of the center of the cavity portion, unnecessary etching of the substrate is reduced, allowing wide selection for the manufacturing step.

Since the two-dimensional infrared focal plane array according to the invention has an etching stop layer comprising a material resistant to the enchant which is employed when forming the cavity portion within the semiconductor substrate around the cavity portion, unnecessary etching of the substrate is reduced, allowing wide selection of the manufacturing step.

Since the temperature detecting element is formed on the surface of the infrared ray absorbing portion, the infrared focal plane array in which the bolometer material which can not be used in the semiconductor process can be employed.

Since in the two-dimensional infrared focal plane array according to the invention the temperature detecting portion is formed above the readout circuit on the semiconductor substrate, wide selection of the etching method for forming the cavity portion is possible and effective use of available area is obtained by arranging one portion of the components of the readout circuit in the area under the cavity portion.

Since the temperature detecting portion has an infrared ray absorbing structure comprising a reflection film and an interlayer insulating film provided on at least one part of the infrared absorbing portion, the absorption of the infrared ray is easy to control and higher sensitive operation is obtained by absorbing the infrared rays more efficiently.

Since the temperature detecting portion has an optical resonant structure comprising a reflection film, an interlayer insulting film and a metal infrared ray absorbing film provided on at least one portion of the infrared ray absorbing portion, the absorption of the infrared rays is easy to control and higher sensitive operation is obtained by absorbing the infrared rays more efficiently.

Since at least one portion of the splicing pillar is made of the same material as the infrared ray absorbing portion, manufacturing can be simplified.

Since an optical resonant structure comprising a reflection film, an interlayer insulating film and a metal infrared ray absorbing film is provided on at least one part of the infrared ray absorbing portion, and the splicing pillar is formed in one body with the metal infrared ray absorbing film, manufacturing can be simplified.

Since the bolometer thin film is provided as the temperature detecting element in the two-dimensional infrared focal plane array according to the invention, the temperature change can be detected effectively.

Since in the two-dimensional infrared focal plane array according to the invention a ferroelectric film having pyroelectric effect may be adopted as the temperature detecting element, the temperature change can be detected effectively.

Since in the two-dimensional infrared focal plane array according to the invention a thermopile may be adopted as the temperature detecting element, the temperature change can be detected effectively.

Since in the two-dimensional infrared focal plane array according to the invention, the splicing pillar is provided below a position adjacent to the location of the center of the gravity of the infrared ray absorbing portion, the infrared ray absorbing portion structure can be stabilized.

Since in the two-dimensional infrared focal plane array according to the invention, the thermal resistance in the splicing pillar is smaller than the thermal resistance in the support leg, an effect that temperature in the temperature detecting portion is made equal.

According to the manufacturing method for the two-dimensional infrared focal plane array of the invention comprising:

a) on a semiconductor substrate, a step of forming a signal readout circuit, then forming an insulating film, contact portions, further forming metal wirings and a temperature detecting element, and covering with a protective insulating film as a whole;

b) a step of forming sacrifice layer on said protective insulating film, removing an area for forming a splicing pillar layer by photolithography technique, said area being one of said sacrifice layer, then filling a material to be said splicing pillar layer into said removed area;

c) on said sacrifice layer and said splicing pillar layer, a step of forming a thin film to be an infrared absorbing portion, then patterning for deviding said infrared ray absorbing portion for every pixel;

d) a step of etching said sacrifice layer to remove;

e) a step of etching said silicon substrate to form a cavity portion in said silicon substrate, better manufacturing productivity can be obtained.

Since a manufacturing method of the invention comprises a step of flattening the surface of the sacrifice layer and the splicing pillar through an etchback operation of step b), there is a simplifying the formation of the infrared ray absorbing portion.

Since the manufacturing method of the invention comprises a step of forming the cavity portion through anisotropic etching operation of the semiconductor substrate in step e), manufacturing the shape of the cavity portion with better control is possible.

Since the manufacturing method of the invention comprises a step of performing anisotropic etching operation with the use of either of potassium hydroxide, and tetramethyl ammonium hydroxide, the etching operation of the cavity portion can be simplified.

Though several embodiments of the present invention are described above, it is to be understood that the present invention is not limited only to the abovementioned embodiments since various changes and modifications may be made in the invention without departing from the spirit and scope thereof.

What is claimed is:

1. A two-dimensional infrared focal plane array comprising temperature detecting units arranged for every pixel of a corresponding two-dimensional arrangement on a semiconductor substrate, each of said temperature detecting units being formed integrally with signal readout circuitry configured to provide an output signal indicating a change in incident infrared rays detected as a temperature change by an associated temperature detecting unit, wherein each of said temperature detecting units includes a temperature detecting portion for every said pixel, each said temperature detecting portion being supported by support legs on said semiconductor substrate, each support leg comprising a high thermal resistance material reducing heat flow to said semiconductor substrate, further wherein each said temperature detecting portion includes a temperature detecting element and a corresponding infrared ray absorbing portion, each infrared ray absorbing portion being spliced by at least one splicing pillar to each corresponding temperature detecting element and having an area substantially equal to an area of each pixel arranged in said two-dimensional arrangement except for a divisional margin space.

2. The two-dimensional infrared focal plane array of claim 1, wherein said temperature detecting portion is provided above a cavity portion which is formed in said semiconductor substrate.

3. The two-dimensional infrared focal plane array of claim 2, wherein an infrared absorbing structure comprising a reflection film and an interlayer insulating film is provided on at least one part of said infrared ray absorbing portion.

4. The two-dimensional infrared focal plane array of claim 3, wherein an optical resonant structure comprising a reflection film, an interlayer insulating film and a metal infrared ray absorbing film is provided on at least one part of said infrared ray absorbing portion.

5. The two-dimensional infrared focal plane array of claim 2, wherein at least one part of said splicing pillar is made of the same material as said infrared ray absorbing portion.

6. The two-dimensional infrared focal plane array of claim 2, wherein an optical resonant structure comprising a reflection film, an interlayer insulating film and metal infrared ray absorbing film is provided on at least one part of said infrared ray absorbing portion, and said splicing pillar is formed in one body with said reflection film.

7. The two-dimensional infrared focal plane array of claim 2, wherein at least one part of said splicing pillar is formed of a same material as said infrared ray absorbing portion and a gap is provided in a portion of the splicing pillar in contact with said temperature detecting portion.

8. The two-dimensional infrared focal plane array of claim 2, wherein at least one etching hole penetrating from said infrared ray absorbing portion to said cavity portion is provided in a vicinity of a center of said cavity portion.

9. The two-dimensional infrared focal plane array of claim 2, wherein an etching stop layer is provided of a material resistant to an etchant which is employed when forming said cavity portion in said semiconductor substrate around said cavity portion.

10. The two-dimensional infrared focal plane array of claim 2, wherein said temperature detecting element is formed on a surface of said infrared ray absorbing portion.

11. The two-dimensional infrared focal plane array of claim 1, wherein said temperature detecting portion is provided above a readout circuit on said semiconductor substrate.

12. The two-dimensional infrared focal plane array of claim 11, wherein an infrared absorbing structure comprising a reflection film and an interlayer insulating film is provided on at least one part of said infrared ray absorbing portion.

13. The two-dimensional infrared focal plane array of claim 11, wherein an optical resonant structure comprising a reflection film, an interlayer insulating film and a metal infrared ray absorbing film is provided on at least one part of said infrared ray absorbing portion.

14. The two-dimensional infrared focal plane array of claim 11, wherein at least one part of said splicing pillar is made of a same material as said infrared ray absorbing portion.

15. The two-dimensional infrared focal plane array of claim 11, wherein an optical resonant structure comprising a reflection film, an interlayer insulating film and metal infrared ray absorbing film is provided on at least one part of said infrared ray absorbing portion, and said splicing pillar is formed in one body with said reflection film.

16. The two-dimensional infrared focal plane array of claim 1, wherein a bolometer thin film is provided as said temperature detecting element.

17. The two-dimensional infrared focal plane array of claim 1, wherein a ferroelectric film having a pyroelectric effect is employed as said temperature detecting element.

18. The two-dimensional infrared focal plane array of claim 1, wherein said splicing pillar is provided below a position adjacent to a center of gravity of said infrared ray absorbing portion.

19. The two-dimensional infrared focal plane array of claim 1, wherein a thermal resistance of said splicing pillar is smaller than a thermal resistance of each support leg.

* * * * *